(12) United States Patent
Hayakawa et al.

(10) Patent No.: US 8,861,257 B2
(45) Date of Patent: Oct. 14, 2014

(54) NONVOLATILE MEMORY ELEMENT, MANUFACTURING METHOD THEREOF, NONVOLATILE MEMORY DEVICE, AND DESIGN SUPPORT METHOD FOR NONVOLATILE MEMORY ELEMENT

(75) Inventors: Yukio Hayakawa, Kyoto (JP); Takumi Mikawa, Shiga (JP); Takeki Ninomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 168 days.

(21) Appl. No.: 13/634,700

(22) PCT Filed: Nov. 24, 2011

(86) PCT No.: PCT/JP2011/006526
§ 371 (c)(1),
(2), (4) Date: Sep. 13, 2012

(87) PCT Pub. No.: WO2012/070238
PCT Pub. Date: May 31, 2012

(65) Prior Publication Data
US 2013/0010529 A1      Jan. 10, 2013

(30) Foreign Application Priority Data

Nov. 24, 2010    (JP) .................................. 2010-261853

(51) Int. Cl.
*G11C 11/00*       (2006.01)
*H01L 27/10*       (2006.01)
(Continued)

(52) U.S. Cl.
CPC ............ *H01L 27/101* (2013.01); *H01L 27/2427* (2013.01); *G11C 13/0007* (2013.01); *G11C*
(Continued)

(58) Field of Classification Search
CPC ............ H01L 27/2427; H01L 27/2418; H01L 27/2463; H01L 45/1233; H01L 45/146; H01L 45/04

USPC .................................... 365/148, 158, 100, 46
See application file for complete search history.

(56) References Cited

U.S. PATENT DOCUMENTS 7,629,198 B2 *  12/2009  Kumar et al. ................. 438/104
7,639,523 B2    12/2009  Celinska et al.
(Continued)

FOREIGN PATENT DOCUMENTS

JP       2009-123900       6/2009
JP       2011-71380        4/2011
(Continued)

OTHER PUBLICATIONS

International Search Report issued Dec. 27, 2011 in corresponding International Application No. PCT/JP2011/006526.

(Continued)

*Primary Examiner* — Viet Q Nguyen
(74) *Attorney, Agent, or Firm* — Wenderoth, Lind & Ponack, L.L.P.

(57) ABSTRACT

A nonvolatile memory element includes a variable resistance layer located between a lower electrode and an upper electrode and having a resistance value that reversibly changes based on electrical signals applied between these electrodes. The variable resistance layer includes at least two layers: a first variable resistance layer including a first transition metal oxide; and a second variable resistance layer including a second transition metal oxide and a transition metal compound. The second transition metal oxide has an oxygen content atomic percentage lower than an oxygen content atomic percentage of the first transition metal oxide, the transition metal compound contains either oxygen and nitrogen or oxygen and fluorine, and the second transition metal oxide and the transition metal compound are in contact with the first variable resistance layer.

10 Claims, 22 Drawing Sheets

(51) Int. Cl.
*H01L 45/00* (2006.01)
*H01L 27/02* (2006.01)
*H01L 27/24* (2006.01)
*G11C 13/00* (2006.01)

(52) U.S. Cl.
CPC ............... 2213/32 (2013.01); *G11C 2213/34* (2013.01); *G11C 2213/55* (2013.01); *H01L 45/08* (2013.01); *H01L 45/1233* (2013.01); *H01L 45/146* (2013.01); *H01L 45/1625* (2013.01); *H01L 45/1641* (2013.01); *H01L 45/1675* (2013.01); *H01L 27/02* (2013.01)
USPC .............. 365/148; 365/158; 365/100; 365/46

(56) References Cited

U.S. PATENT DOCUMENTS

| | | | |
|---|---|---|---|
| 7,678,607 B2 * | 3/2010 | Chiang et al. | 438/104 |
| 7,732,251 B2 * | 6/2010 | Hoffman et al. | 438/104 |
| 7,778,063 B2 | 8/2010 | Brubaker et al. | |
| 7,872,900 B2 | 1/2011 | Paz de Araujo et al. | |
| 8,022,502 B2 | 9/2011 | Kanzawa et al. | |
| 8,097,878 B2 * | 1/2012 | Kumar et al. | 257/43 |
| 8,565,005 B2 * | 10/2013 | Takagi et al. | 365/148 |
| 2008/0106925 A1 | 5/2008 | Paz de Araujo et al. | |
| 2008/0106926 A1 | 5/2008 | Brubaker et al. | |
| 2008/0106927 A1 | 5/2008 | Celinska et al. | |
| 2008/0107801 A1 | 5/2008 | Celinska et al. | |
| 2009/0121208 A1 | 5/2009 | Nagashima et al. | |
| 2009/0283736 A1 | 11/2009 | Kanzawa et al. | |
| 2010/0090172 A1 | 4/2010 | Celinska et al. | |
| 2010/0283028 A1 | 11/2010 | Brubaker et al. | |
| 2010/0308298 A1 | 12/2010 | Ninomiya et al. | |
| 2011/0103131 A1 | 5/2011 | Katayama et al. | |
| 2011/0233510 A1 | 9/2011 | Kanzawa et al. | |
| 2011/0294259 A1 | 12/2011 | Kanzawa et al. | |

FOREIGN PATENT DOCUMENTS

| | | |
|---|---|---|
| WO | 2008/058264 | 5/2008 |
| WO | 2008/149484 | 12/2008 |
| WO | 2010/038423 | 4/2010 |
| WO | 2010/064410 | 6/2010 |
| WO | 2010/125780 | 11/2010 |

OTHER PUBLICATIONS

Reply to the Written Opinion issued Dec. 27, 2011 in corresponding International Application No. PCT/JP2011/006526 (with English translation).

I. G. Baek et al., "Highly Scalable Non-volatile Resistive Memory using Simple Binary Oxide Driven by Asymmetric Unipolar Voltage Pulses", IEEE IEDM 2004 Technical Digest, Dec. 13-15, 2004.

* cited by examiner

Access M11 to write "0"

Access M11 to write "1"

Access M11 to read

NONVOLATILE MEMORY ELEMENT, MANUFACTURING METHOD THEREOF, NONVOLATILE MEMORY DEVICE, AND DESIGN SUPPORT METHOD FOR NONVOLATILE MEMORY ELEMENT

TECHNICAL FIELD

The present invention relates to nonvolatile memory elements, methods of manufacturing the same, nonvolatile memory devices, and design support methods for nonvolatile memory elements, and particularly to a variable resistance nonvolatile memory element including a variable resistance layer of which resistance has a value changing by application of electric pulses and is maintained at the changed value, and to a method of manufacturing the variable resistance nonvolatile memory element.

BACKGROUND ART

In recent years, along with development of the digital technology, electronic devices such as portable information devices and information home appliances have increasingly higher-level functionalities. There is thus a higher demand on nonvolatile memory elements for an increase in capacity, a reduction in power for writing, an increase in speed for writing/reading, and a longer operating life.

In response to such a demand, it is said that there is a limit on the miniaturization of existing flash memories using floating gates. On the other hand, a nonvolatile memory element using a variable resistance layer as a material of a memory unit (i.e., a variable resistance memory) can be composed of a simple-structured memory element represented by a two-terminal variable resistance element, which therefore lays high expectations for further miniaturization, increase in speed, and reduction in power consumption.

The variable resistance layer which is used as a material of the memory unit will have resistance changing in value from high resistance to low resistance or from low resistance to high resistance by input of electric pulses or the like, for example. In this case, it is necessary that two values of low resistance and high resistance be clearly distinguished, a change between low resistance and high resistance be stable at high speed, and these two values be held in a nonvolatile manner. As an example of this variable resistance element, a nonvolatile memory element using stacked transition metal oxides with different oxygen content atomic percentages for the variable resistance layer has been proposed. There is a disclosure that, in this variable resistance element, a change in resistance is stabilized by selectively causing an oxidation-reduction reaction at an electrode interface in contact with the variable resistance layer with a high oxygen content atomic percentage (see Patent Literature 1, for example).

FIG. 23 shows a conventional variable resistance nonvolatile memory element 50 including a variable resistance element 55. A first line 101 is formed on a substrate 100, and a first interlayer insulating layer 102 is formed so as to cover this first line 101. A first contact plug 104 is formed which penetrates the first interlayer insulating layer 102 and is connected to the first line 101. The variable resistance element 55 made up of a lower electrode 105, a variable resistance layer 106, and an upper electrode 107 is formed on the first interlayer insulating layer 102 so as to cover the first contact plug 104. A second interlayer insulating layer 108 is formed so as to cover the variable resistance layer 55, and a second contact plug 110 penetrating the second interlayer insulating layer 108 connects the upper electrode 107 and a second line 111.

The variable resistance layer 106 has a laminated structure of a first variable resistance layer 106$x$ and a second variable resistance layer 106$y$ and comprises transition metal oxides of one kind. The transition metal oxide of the first variable resistance layer 106$x$ has a higher oxygen content atomic percentage than the oxygen content atomic percentage of the transition metal oxide of the second variable resistance layer 106$y$.

With such a structure, applying voltage to the variable resistance element 55 will result in the most of the voltage being applied to the first variable resistance layer 106$x$ that is high in oxygen content atomic percentage and has a larger resistance value. Moreover, near this interface, there is abundant oxygen which can contribute to the reaction. Thus, the oxidation-reduction reaction selectively occurs at the interface between the upper electrode 107 and the first variable resistance layer 106$x$ so that the resistance can stably change.

Non Patent Literature 1 discloses a nonvolatile memory including 1T1R (meaning one transistor and one variable resistance element which are connected in series) memory cells each of which uses a transition metal oxide for the variable resistance element. According to the disclosure, a thin film of the transition metal oxide usually serves as an insulator and has a conductive path formed therein by initialization for causing a pulsed change in the resistance value. The conductive path allows switching between a high resistance state and a low resistance state. Here, "initialization" refers to a process of changing a manufactured variable resistance element or variable resistance nonvolatile memory element into a state in which the high resistance state and the low resistance state can be reversibly changed according to applied voltage (or polarity of applied voltage). Specifically, "initialization" refers to a process of applying higher voltage than write voltage to the manufactured variable resistance element or variable resistance nonvolatile memory element which has a very large resistance value. This initialization not only places the variable resistance element or variable resistance nonvolatile memory element in a state in which the high resistance state and the low resistance state can be reversibly changed, but also lowers the resistance value of the variable resistance element or variable resistance nonvolatile memory element.

FIG. 24 shows characteristics of dependency of a thickness of the transition metal oxide relative to voltage for initialization, shown in Non Patent Literature 1. Characteristics of the transition metal oxide (TMO) of four kinds: NiO, $TiO_2$, $HfO_2$, and $ZrO_2$ are shown, and required voltage for initialization depends on the kind of the transition metal oxide and is higher as the thickness of the transition metal oxide increases. Thus, in order to lower the voltage for initialization, it is preferable to reduce the thickness of the transition metal oxide.

CITATION LIST

Patent Literature

[PTL 1] International Application Publication No. 2008/149484

Non Patent Literature

[NPL 1] I. G. Baek et al., IEDM2004, p. 587

SUMMARY OF INVENTION

Technical Problem

The process of manufacturing the variable resistance memory includes a step of heating at about 400 degrees Celsius to form an electrode interconnection comprising copper, aluminum, or the like. The inventors found through experiments that such a heating step creates small projections (hillocks) in some electrode materials from upper and lower electrodes toward the variable resistance layer. In the case where the hillocks are created in the electrode materials, the conductive path in the variable resistance layer is formed from each of the hillocks. This is because the transition metal oxide is partially thin due to the hillocks created toward the variable resistance layer. In addition, the initial insulation of the variable resistance element is different and has increasing variations depending not only on the thickness of the transition metal oxide, but also on shape, size, and density of the hillocks. Furthermore, the shape, size, and density of hillocks strongly depend on electrode materials and process factors, such as layer stress and a temperature, and therefore are very difficult to control. In view of the foregoing, such hillocks should desirably not be created in the electrodes in order to stabilize the initial resistance value (the resistance value before initialization) of the variable resistance element.

For the electrode material of the variable resistance element, platinum (Pt), iridium (Ir), palladium (Pd), copper (Cu), silver (Ag), gold (Au), and the like are used. The inventors found that a heating process at about 400 degrees Celsius creates hillocks in electrodes of Pt and Pd, but does not create hillocks in an electrode of Ir among the above electrode materials. Ir has a coefficient of thermal expansion of 6.4E–6 ($°$ C.$^{-1}$) that is lower than the coefficient of thermal expansion of Pt; 8.8E–6 ($°$ C.$^{-1}$). Furthermore, Ir has Young's modulus of 529E+9 (N/m$^2$) that is higher than Young's modulus of Pt; 152E+9 (N/m$^2$). Here, "E+n" represents "$\times 10^{+n}$". With these physical properties, Ir is less likely to undergo stress-induced plastic deformation than Pt and therefore probably does not create hillocks in the heating process at about 400 degrees Celsius. FIGS. 1A and 1B show transmission electron microscope (TEM) images about such hillocks, obtained in the experiments by the inventors. In FIG. 1A, a TEM image of a cross section of the variable resistance element using Pt as an electrode material is shown. On a lower electrode 301$a$, a first variable resistance layer 302$a$, a second variable resistance layer 303$a$, and an upper electrode 304$a$ are stacked. It is clear that the second variable resistance layer 303$a$ is partially thin due to hillocks in the upper electrode. In FIG. 1B, a TEM image of a cross section of the variable resistance element using Ir as an electrode material is shown. On a lower electrode 301$b$, a first variable resistance layer 302$b$, a second variable resistance layer 303$b$, and an upper electrode 304$b$ are stacked. It can be seen that the second variable resistance layer has a uniform thickness without hillocks in the upper electrode. With no hillocks in the electrode, the initial resistance value of the variable resistance element can be controlled according to a thickness of the transition metal oxide, and variations thereof will be significantly improved. However, since there are no hillocks in the electrode, no part of the transition metal oxide is thin. Accordingly, in forming a conductive path in the transition metal oxide (i.e., the variable resistance film) of the variable resistance element just manufactured, in initialization in which voltage whose absolute value is larger than an absolute value of typical drive voltage for use in changing the resistance is applied to the variable resistance film one time to multiple times, the voltage for initialization (i.e., the initialization voltage) needs to be higher than that in the case where there are hillocks in the electrode, which is an impediment to the initialization at low voltage in the variable resistance element.

Although a reduction in thickness of the second variable resistance layer can lower the initialization voltage, this is not desirable in the light of reliability.

Thus, the present invention aims to provide a nonvolatile memory element and a method of manufacturing the same, which solve the above problems and in which the initialization at low voltage is possible without forming hillocks at an interface between an electrode and a variable resistance film.

Solution to Problem

To solve the above problems, a nonvolatile memory element according to an aspect of the present invention comprises a first electrode and a second electrode that are formed above a semiconductor substrate; and a variable resistance layer located between the first electrode and the second electrode and having a resistance value that reversibly changes based on an electric signal applied between the first electrode and the second electrode, wherein the variable resistance layer comprises at least two layers including a first variable resistance layer and a second variable resistance layer, the first variable resistance layer has a first face connected to the first electrode, the first variable resistance layer has a second face connected to a first face of the second variable resistance layer, the first variable resistance layer comprises a first transition metal oxide, the second variable resistance layer comprises a second transition metal oxide and a first transition metal compound, the second transition metal oxide has an oxygen content atomic percentage lower than an oxygen content atomic percentage of the first transition metal oxide, the first transition metal compound contains either oxygen and nitrogen or oxygen and fluorine and is in contact with at least part of the second face of the first variable resistance layer, and the second transition metal oxide is in contact with a remaining part of the second face of the first variable resistance layer.

With this structure, it is possible to provide a nonvolatile memory element in which the initialization at low voltage is possible without forming hillocks at an interface between an electrode and a variable resistance film. Specifically, with the above structure, the maximum area of the second transition metal oxide in the plane direction is reduced so that the leak current in the variable resistance layer is reduced and the density of current flowing in the first transition metal oxide is increased, which facilitates formation of a conductive path in the first transition metal oxide and reduces the initialization voltage, with the result that the element can be initialized at low voltage.

Specifically, the second variable resistance layer in contact with the first variable resistance layer is composed of the second transition metal oxide that has a low oxygen content atomic percentage, i.e., a small resistance value, and a transition metal compound that contains either oxygen and nitrogen or oxygen and fluorine and has a large resistance value, so that most of the current flowing in the second variable resistance layer flows in the second transition metal oxide having a small resistance value and then flows in the first variable resistance layer. Thus, the density of current flowing from the second variable resistance layer to the first variable resistance layer is higher than that in the case where the second variable resistance layer is composed of a single transition metal oxide. In particular, the initialization voltage for the variable resistance element and further the nonvolatile memory element according to an aspect of the present invention is reduced.

Furthermore, with the above structure, the transition metal compound is formed by terminating a dangling bond of a transition metal oxide by nitrogen or fluorine. This nitrogen-terminated or fluorine-terminated transition metal compound has higher density and a reduced volume increase as compared to a transition metal compound formed by terminating the dangling bond by oxygen, that is, oxidized, with the same resistivity. Accordingly, as compared to the case of oxidizing a transition metal oxide to form a transition metal oxide, nitriding or fluorinating a transition metal oxide to form a transition metal compound allows a further reduction in the volume increase and allows a further reduction in the compressive stress on the upper electrode, thereby making it possible to reduce the separation which occurs at the interface between the upper electrode and the variable resistance layer.

It is to be noted that the second transition metal oxide and the first transition metal compound may comprise a same transition metal. The second transition metal oxide and the transition metal compound which comprise the same transition metal have a small difference in the coefficient of thermal expansion, thus allowing a reduction in the stress which is generated in a manufacturing process and attributed to a heat history.

Furthermore, it may be that the second transition metal oxide is disposed in a central region of the second variable resistance layer, and the first transition metal compound is disposed in a peripheral region of the second variable resistance layer.

With this, the transition metal compound having a large resistance value is disposed on a lateral side of the second variable resistance layer serving as a main path for the leak current so that the leak current in the second variable resistance layer can be reduced and the density of current flowing in the first transition metal oxide is increased, which facilitates formation of a conductive path in the first transition metal oxide and reduces the initialization voltage, with the result that the element can be initialized at low voltage.

Furthermore, it may be possible that the second transition metal oxide is disposed in a peripheral region of the second variable resistance layer, and the first transition metal compound is disposed in a central region of the second variable resistance layer.

With this, the maximum area of the second transition metal oxide in the plane direction can be reduced using an area of the transition metal compound in the plane direction so that the transition metal compound can be thinner than that in a structure where the materials in the peripheral region and the central region are opposite, with the result that the heat history in forming the transition metal oxide can be reduced, which makes it possible to reduce the phenomenon of oxygen dispersion from the first transition metal oxide having a high oxygen content atomic percentage to the second transition metal oxide having a low oxygen content atomic percentage. Furthermore, a reduction in the thickness of the transition metal compound allows a reduction in the volume increase of the transition metal compound and allows a reduction in the compressive stress on the upper electrode, with the result that the separation between the variable resistance layer and the upper electrode can be reduced.

Furthermore, in order to solve the above problems, a method of manufacturing a nonvolatile memory element according to an aspect of the present invention includes: forming a lower electrode above a semiconductor substrate; forming a second transition metal oxide on the lower electrode; forming a first variable resistance layer comprising a first transition metal oxide on the second transition metal oxide; forming an upper electrode on the first variable resistance layer; and forming a second variable resistance layer by nitriding or fluorinating part of the second transition metal oxide to form a transition metal compound, the second variable resistance layer comprising the second transition metal oxide and the transition metal compound, the second transition metal oxide being in contact with the first variable resistance layer, and the transition metal compound being in contact with the first variable resistance layer.

With this, an oxidation-reduction reaction occurs at an interface between the upper electrode and the first variable resistance layer, which results in the above nonvolatile memory element. Furthermore, even when a surface of the contact plug is partly exposed from a lower-layer line due to misalignment, tungsten in the exposed contact plug is simultaneously nitrided or fluorinated at the time of nitriding or fluorinating the part of the second transition metal oxide, resulting in tungsten nitride or tungsten fluoride that has conductive properties. In particular, tungsten nitride has an effect in reducing the spread of oxidation, which allows a reduction in the oxidation of an exposed tungsten surface when the variable resistance element is covered with an insulating film. Thus, tungsten nitride can reduce an increase in contact resistance.

Here, the nitrogen or fluorine contained in the first transition metal compound is combined with a dangling bond contained in the first transition metal compound, to terminate the dangling bond.

Furthermore, the second transition metal oxide and the first transition metal compound are equal in thickness.

Furthermore, it may be possible that the variable resistance layer further comprises a third variable resistance layer, the variable resistance layer comprises three layers: the first variable resistance layer; the second variable resistance layer; and the third variable resistance layer, the third variable resistance layer comprises a third transition metal oxide and a second transition metal compound, the third transition metal oxide has a resistivity lower than resistivities of the first transition metal oxide and the second transition metal oxide, the second transition metal compound has a resistivity lower than a resistivity of the first transition metal compound, the second transition metal compound contains either oxygen and nitrogen or oxygen and fluorine and is in contact with a second face of the first transition metal compound, and the third transition metal oxide is in contact with a second face of the second transition metal oxide.

Furthermore, in order to solve the above problems, another method of manufacturing a nonvolatile memory element according to an aspect of the present invention includes: forming a lower electrode above a semiconductor substrate; forming a first variable resistance layer comprising a first transition metal oxide on the lower electrode; forming a second transition metal oxide on the first variable resistance layer; forming an upper electrode on the second transition metal oxide; and forming a second variable resistance layer by nitriding or fluorinating part of the second transition metal oxide to form a transition metal compound, the second variable resistance layer comprising the second transition metal oxide and the transition metal compound, the second transition metal oxide being in contact with the first variable resistance layer, and the transition metal compound being in contact with the first variable resistance layer.

With this, no spontaneous oxidation occurs on the surface of the first transition metal oxide having a high oxygen content atomic percentage even when the element is exposed to the air after formation of the first transition metal oxide, with the result that the impact of a spontaneous oxide film on a face on which the first transition metal oxide and the second transition metal oxide are in contact with each other can be eliminated without surface treatment such as cleansing, which stabilizes formation of a conductive path in the first transition metal oxide.

Here, in the above manufacturing method, it is preferable that, in the forming of a second variable resistance layer, an exposed lateral side of the second transition metal oxide be nitrided or fluorinated to form the second transition metal oxide in a central region of the second variable resistance layer and form the transition metal compound in a peripheral region of the second variable resistance layer.

With this, the lateral side of the second variable resistance layer is nitrided or fluorinated to form the transition metal compound so that damage generated on the lateral side in the manufacturing process can be removed, allowing a reduction of the predominant leak current in the second transition metal oxide, with the result that the current flowing to the first transition metal oxide increases, which allows a decrease in the initialization voltage and enables the initialization at low voltage.

Here, in the forming of a second variable resistance layer, an exposed lateral side of the second transition metal oxide is nitrided or fluorinated so that nitrogen or fluorine is combined with a dangling bond present in the second transition metal oxide, to terminate the dangling bond so as to form the first transition metal compound.

Furthermore, it may be possible that, in the forming of a second variable resistance layer, part of a surface, covered with the first variable resistance layer, of the second transition metal oxide is nitrided or fluorinated with the first variable resistance layer to form the transition metal compound in a central region of the second variable resistance layer and form the second transition metal oxide in a peripheral region of the second variable resistance layer.

With this, it is possible to form the third transition metal oxide in part of a surface of the second variable resistance layer without processing of the first variable resistance layer, which allows a reduction of processing damage in the first variable resistance layer.

It is to be noted that the present invention can be implemented not only as the above nonvolatile memory element and a method of manufacturing the same, but also as a variable resistance element that is a core component of the nonvolatile memory element, a nonvolatile memory device including the nonvolatile memory elements in array, methods of manufacturing these variable resistance element and nonvolatile memory device, a design support method for the nonvolatile memory element, a program which causes a computer to execute the design support method, and a computer-readable recording medium, such as a CD-ROM, on which the program is recorded.

Advantageous Effects of Invention

According to an implementation of the present invention, the maximum area of the second transition metal oxide in the plane direction is reduced so that the leak current in the variable resistance layer is reduced and the density of current flowing to the first variable resistance layer is increased, which reduces the initialization voltage for initializing the variable resistance element and facilitates formation of a conductive path in the first variable resistance layer, thereby producing an effect that the nonvolatile memory element can be initialized at low voltage.

Furthermore, with the method of manufacturing the nonvolatile memory element according to an aspect of the present invention, a damaged layer is recovered by nitridation or fluorination of the lateral side of the nonvolatile memory element, and the current density of current possible to flow in the nonvolatile memory element increases, with the result that the initialization voltage for the nonvolatile memory element is reduced.

Furthermore, as compared to the case of using a transition metal oxide, the use of the transition metal compound allows a further reduction in the volume increase and makes it further possible to reduce the separation between the upper electrode and the variable resistance layer.

Furthermore, even in the case where the miniaturization of the element diminishes a margin of the alignment and exposes part of the contact plug from the lower-layer line, tungsten nitride or tungsten fluoride can be formed, with the result that the conductive properties can be maintained. Especially, tungsten nitride is suitable for reducing an increase in the contact resistance because tungsten nitride functions as an antioxidant film when an interlayer insulating film which covers the variable resistance element is being formed.

Accordingly, the present invention can provide not only a nonvolatile memory element in which the initialization at low voltage is possible without forming hillocks at an interface between an electrode and a variable resistance film, but also a nonvolatile memory element or the like which can solve the problems in the manufacturing process, such as film separation and an increase in contact resistance, and further allows initialization at lower voltage. Thus, the practical value of the present invention is very high today with an increasing diffusion of electronic devices, such as portable information devices, which require memories operating at low voltage.

DESCRIPTION OF EMBODIMENTS

With reference to the drawings, a nonvolatile memory element and a nonvolatile memory device according to an implementation of the present invention shall be described in detail below.

First Embodiment

First, a nonvolatile memory element according to the first embodiment of the present invention is described.

[Structure]

Figure 1A:
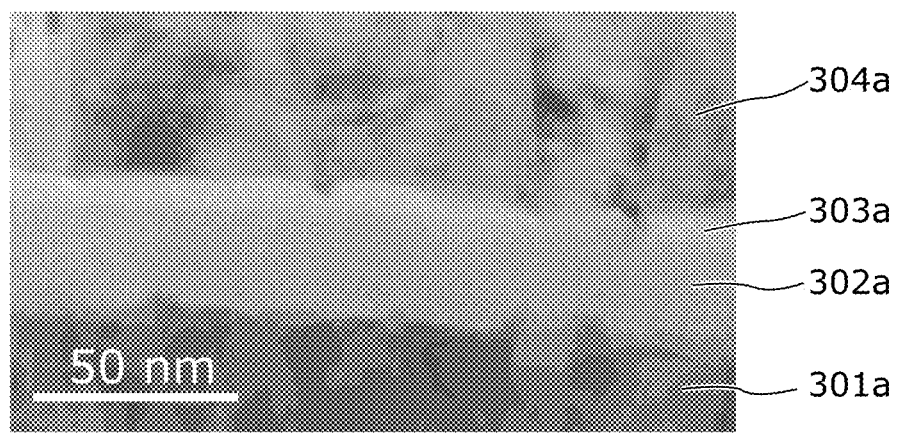
FIG. 1A shows a TEM image of a cross section of a variable resistance element using Pt as an electrode material.
Figure 1B:
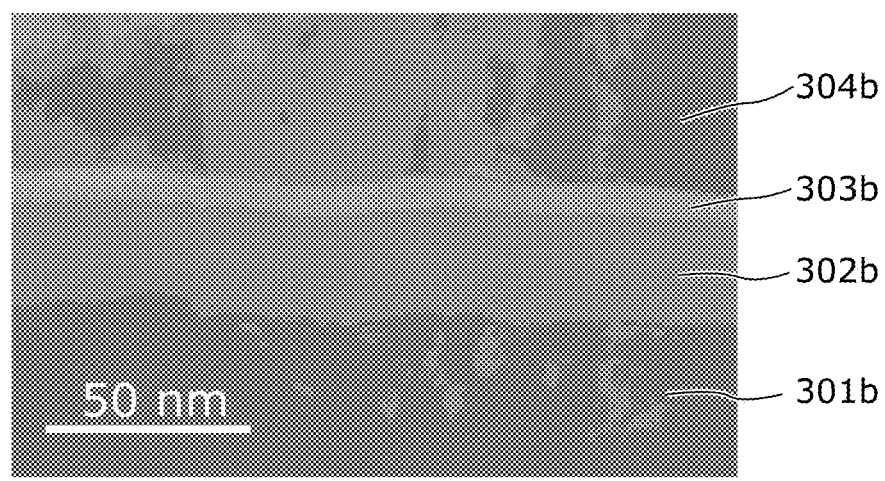
FIG. 1B shows a TEM image of a cross section of a variable resistance element using Ir as an electrode material.
Figure 2A:
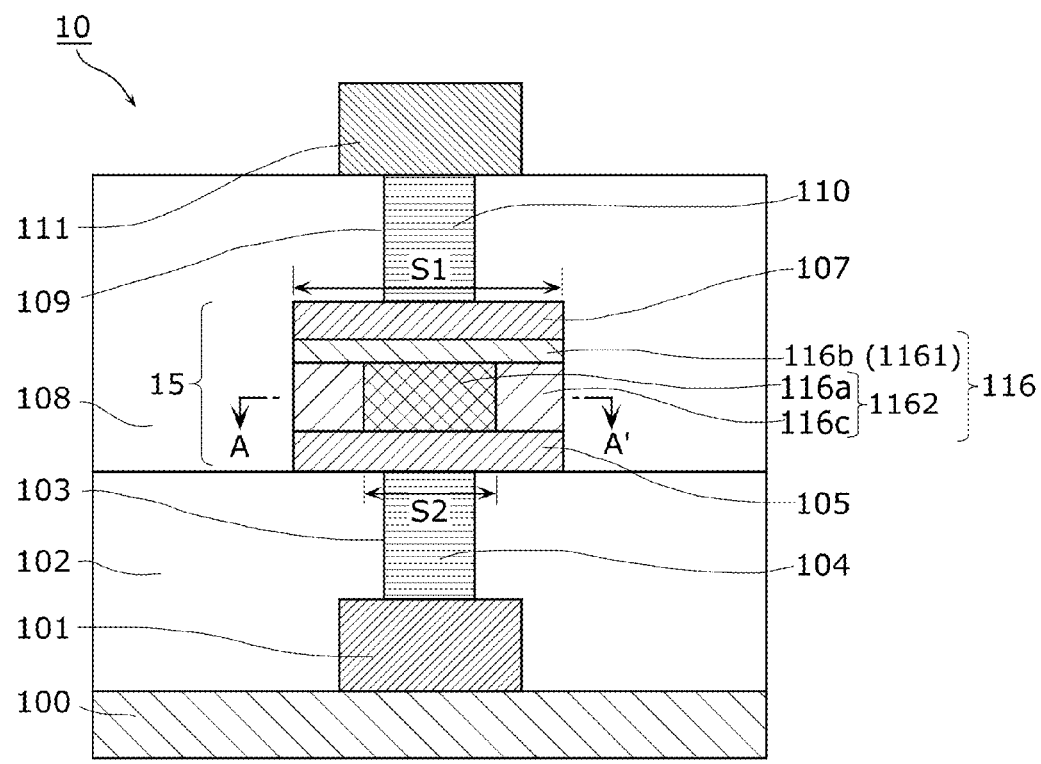
FIG. 2A is a cross-sectional view of a nonvolatile memory element according to the first embodiment of the present invention.
Figure 2B:
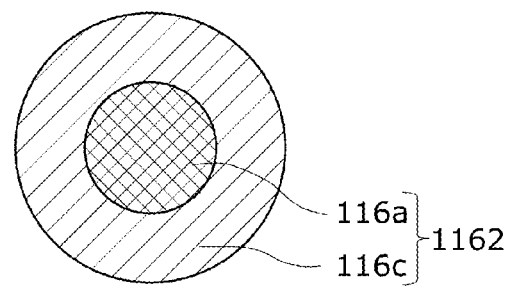
FIG. 2B shows a cross-sectional view taken along A-A' of FIG. 2A in the direction perpendicular to the drawing sheet.

FIG. 2A is a cross-sectional view of a nonvolatile memory element 10 according to the first embodiment of the present invention. FIG. 2B shows a cross-sectional view taken along A-A' of FIG. 2A. As shown in FIG. 2A, the nonvolatile memory element 10 according to this embodiment is a variable resistance nonvolatile memory element and includes a substrate 100, a first line 101, a first interlayer insulating layer 102, a first contact plug 104, a variable resistance element 15, a second interlayer insulating layer 108, a second contact plug 110, and a second line 111. In a practical structure of a memory cell using the nonvolatile memory element 10 according to this embodiment, one of the first line 101 and the second line 111 is connected to a switching element (i.e., a diode or a transistor) which is set to be ON when the cell is selected and be OFF when the cell is not selected. The connection to the switching element may be achieved by direct connection to the electrode (105 or 107) of the nonvolatile memory element 10 not via the contact plug (104 or 110) or the line (101 or 111).

The substrate 100 is a semiconductor substrate comprising silicon (Si) or the like. The first line 101 is wiring formed on the substrate 100. The first interlayer insulating layer 102 is an interlayer insulating layer composed of a silicon oxide film or the like having a thickness of 500 to 1000 nm, which covers the first line 101 on the substrate 100. A first contact hole 103 is a contact hole having a diameter size of 50 to 300 nm through which the first contact plug 104 penetrating the first interlayer insulating layer 102 is electrically connected to the first line 101. The first contact plug 104 is a conductor containing, as a primary component, tungsten embedded in the first contact hole 103.

The variable resistance element 15 includes: a lower electrode 105 having a thickness of 5 to 100 nm and comprising tantalum nitride or the like, formed on the first interlayer insulating layer 102 so as to cover the first contact plug 104; a variable resistance layer 116 having a thickness of 20 to 100 nm; and an upper electrode 107 having a thickness of 5 to 100 nm and comprising a noble metal (such as Pt, Ir, or Pd) or the like. The second interlayer insulating layer 108 is an interlayer insulating layer composed of a silicon oxide film or the like having a thickness of 500 to 1000 nm, which covers the variable resistance element 15. A second contact hole 109 is a contact hole having a diameter size of 50 to 300 nm through which the second contact plug 110 penetrating the second interlayer insulating layer 108 is electrically connected to the upper electrode 107. The second contact plug 110 is a conductor containing, as a primary component, tungsten embedded in the second contact hole 109. The second line 111 is formed on the second interlayer insulating layer 108 so as to cover the second contact plug 110.

It is sufficient that the nonvolatile memory element 10 according to an implementation of the present invention includes at least the variable resistance element 15, and the other constituents: the substrate 100, the first line 101, the first interlayer insulating layer 102, the first contact hole 103, the first contact plug 104, the second interlayer insulating layer 108, the second contact hole 109, the second contact plug 110, and the second line 111, are not indispensable.

Here, the variable resistance layer 116 is a layer disposed between an upper electrode (that is an example of the first electrode) 107 and a lower electrode (that is an example of the second electrode) 105 and has a resistance value that reversibly changes based on electric signals applied between these electrodes (the lower electrode 105 and the upper electrode 107) (more specifically, this layer reversibly changes between a high resistance state and a low resistance state according to a polarity of voltage applied between these electrodes). The variable resistance layer 116 includes at least two layers: a first variable resistance layer 1161 comprising a first transition metal oxide 116b; and a second variable resistance layer 1162 comprising a second transition metal oxide 116a and a transition metal compound 116c. This variable resistance layer 116 (i.e., the first transition metal oxide 116b, the second transition metal oxide 116a, and the transition metal compound 116c) comprises a transition metal oxide which contains tantalum (Ta) as a primary component. Here, the first variable resistance layer 1161 is disposed so as to have a first face (that is the top surface herein) in contact with the lower surface of the first electrode (that is the upper electrode 107 herein), and a second face (that is the bottom surface herein) of the first variable resistance layer 1161 is connected to the first face (that is the top surface herein) of the second variable resistance layer 1162.

The second transition metal oxide 116a has a lower oxygen content atomic percentage than an oxygen content atomic percentage of the first transition metal oxide 116b. Thus, the second transition metal oxide 116a has a smaller resistance value than a resistance value of the first transition metal oxide 116b. Furthermore, the transition metal compound 116c contains either oxygen and nitrogen or oxygen and fluorine, and the transition metal compound 116c has a larger resistance value than a resistance value of the second transition metal oxide 116a. Thus, the second transition metal oxide 116a has a smaller resistance value than resistance values of the first transition metal oxide 116b and the transition metal compound 116c.

The resistance value of the transition metal compound 116c may be equal to or different from the resistance value of the first transition metal oxide 116b. Furthermore, the transition metal compound 116c desirably has insulation properties.

Furthermore, the standard electrode potential of a metal of the first electrode is set to be higher than a standard electrode potential of a transition metal of the variable resistance layer or of the second electrode. With such a structure, the resistance of part of the first transition metal oxide 116b changes near the interface between the first electrode 107 and the first transition metal oxide 116b, which enables a stable memory operation.

As can be seen from the structure of the second variable resistance layer 1162 shown in FIGS. 2A and 2B, in the second variable resistance layer 1162 according to this embodiment, the second transition metal oxide 116a having a small resistance value is disposed in a central region of the second variable resistance layer 1162 while the transition metal compound 116c having a large resistance value is disposed in a peripheral region of the second variable resistance layer 1162. The transition metal compound 116c is in contact with at least part of the second face (that is the bottom surface herein) of the first variable resistance layer 1161, and the second transition metal oxide 116a is in contact with the remaining part of the second face (that is the bottom surface herein) of the first variable resistance layer 1161. Here, as shown in FIG. 2A, the second transition metal oxide 116a and the transition metal compound 116c have the same thickness.

With such a structure, the transition metal compound 116c having a large resistance value is disposed on a lateral side of the second transition metal oxide 116a having a small resistance value so that the area of a region S2, in the plane direction, of the second transition metal oxide 116a having a small resistance value (or the contact region between the second transition metal oxide 116a having a small resistance value and the first variable resistance layer 1161) is smaller than the area of an electrode region S1 of the upper electrode 107. As a result, the density of current flowing from the second transition metal oxide 116a to the first transition metal oxide 116b (i.e., the first variable resistance layer 1161) increases, and a conductive path in the first transition metal oxide 116b can easily be formed. This reduces the initialization voltage of the variable resistance element 15 and enables initialization of the variable resistance element 15 at low voltage.

In other words, most of the current flowing in the second variable resistance layer 1162 including the second transition metal oxide 116a and the transition metal compound 116c will flow in the second transition metal oxide 116a having a small resistance value (i.e., the central region of the second variable resistance layer 1162), which increases the density of current flowing from the second variable resistance layer 1162 to the first variable resistance layer 1161 and enables initialization of the variable resistance element 15 at lower voltage. Although the above describes how the density of current flowing from the second variable resistance layer 1162 to the first variable resistance layer 1161 increases, the same applies to the current flowing in the opposite direction (that is, the current flowing from the first variable resistance layer 1161 to the second variable resistance layer 1162).

Figure 3A:
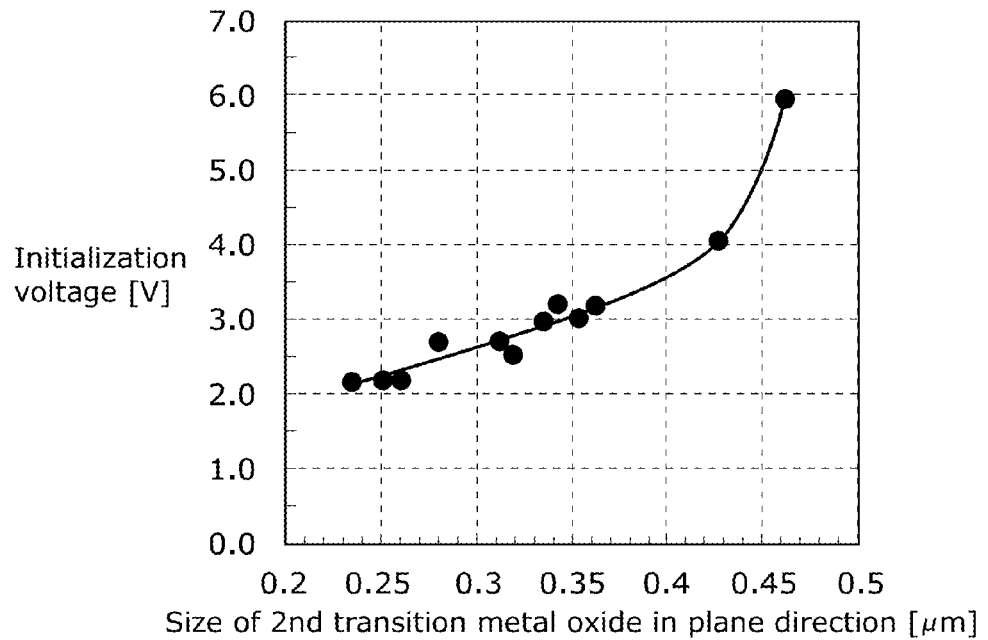
FIG. 3A shows characteristics of dependency of a size, in the plane direction, of the second transition metal oxide relative to initialization voltage.

FIG. 3A shows a relationship between the initialization voltage and the size, in the plane direction, of the second transition metal oxide 116a (that is, to be more accurate, the maximum width in the face in which the second transition metal oxide 116a is in contact with the first variable resistance layer 1161, and in the case where the face is in the shape of a circle, the size is the diameter of the circle) in the nonvolatile memory element according to the first embodiment. Here, the size in the plane direction shown in this figure represents the size measured in an SEM image of a cross section of the variable resistance element. It is to be noted that this figures shows data obtained when the transition metal compound 116c is a transition metal oxide which contains oxygen only. As can be seen from this figure, it is clear that a reduction in size, in the plane direction, of the second transition metal oxide 116a decreases the initialization voltage. Specifically, it should be interpreted that the same applies to this embodiment in which the transition metal compound 116c contains either oxygen and nitrogen or oxygen and fluorine instead of being a transition metal compound which contains oxygen only. Accordingly, a reduction in the size, in the plane direction, of the second transition metal oxide 116a can result in the nonvolatile memory element 10 which can be initialized at low voltage.

Figure 3B:
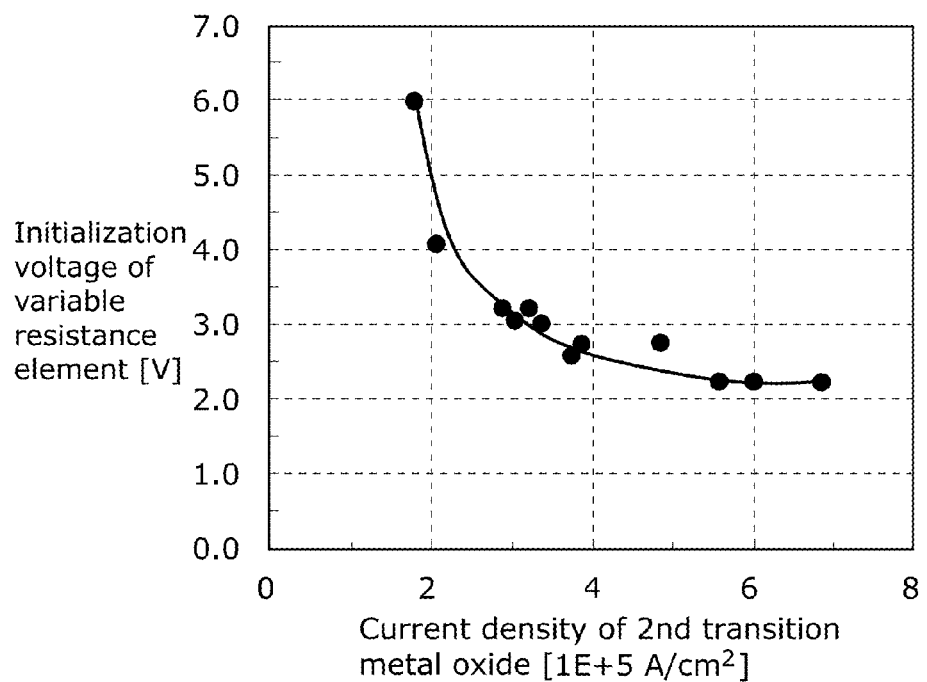
FIG. 3B shows characteristics of dependency of current density of current flowing in the second transition metal oxide relative to initialization voltage of the variable resistance element.

FIG. 3B shows a relationship between the current density of current flowing in the second transition metal oxide 116a and the initialization voltage in the nonvolatile memory element according to the first embodiment and has been created based on data shown in FIG. 3A. As the current density of current flowing in the second transition metal oxide 116a increases, the initialization voltage of the variable resistance element can be reduced further. It is to be noted that this figure also shows data obtained when the transition metal compound 116c is a transition metal oxide which contains oxygen only, but it should be interpreted that what can be found from this figure is that the same applies to the case where the transition metal compound 116c contains either oxygen and nitrogen or oxygen and fluorine as long as the transition metal compound 116c has resistance higher than resistance of the second transition metal oxide 116a. Accordingly, as can be seen from this figure, the nonvolatile memory element 10 according to the first embodiment can be initialized at relatively low initialization voltage (4 V or lower) when the current density of current flowing in the second transition metal oxide 116a is $2E+5$ (A/cm$^2$) or more.

[Manufacturing Method]

FIGS. 4A to 4J show cross-sectional views of the nonvolatile memory element 10, to illustrate a method of manufacturing a major part thereof, according to the first embodiment of the present invention. With reference to these views, the method of manufacturing the major part of the nonvolatile memory element 10 according to this first embodiment is described.

Figure 4A:
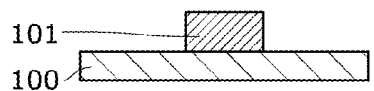
FIG. 4A shows a step in a method of manufacturing a nonvolatile memory element according to the first embodiment of the present invention.

As shown in FIG. 4A, in the step of forming the first line 101, a conductive layer comprising aluminum or the like and having a thickness of 400 to 600 nm is formed on the substrate 100 in which a transistor, a lower-layer line, and the like are formed, and patterning this conductive layer results in the first line 101.

Figure 4B:
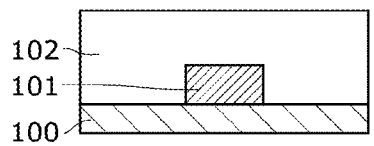
FIG. 4B shows a step in the method of manufacturing the nonvolatile memory element according to the first embodiment of the present invention.

Next, as shown in FIG. 4B, in the step of forming the first interlayer insulating layer 102, an insulating layer is formed on the substrate 100 so as to cover the first line 101 and then has its surface planarized, which results in the first interlayer insulating layer 102 having a thickness of 500 to 1000 nm. Here, the first interlayer insulating layer 102 may comprise a plasma tetraethoxysilane (TEOS) film, or comprise, in order to reduce a parasitic capacity between the lines, a fluorine-containing oxide, such as fluorinated silicate glass (FSG), and a low-k material.

Figure 4C:
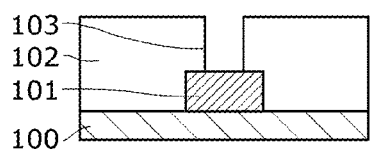
FIG. 4C shows a step in the method of manufacturing the nonvolatile memory element according to the first embodiment of the present invention.

Next, as shown in FIG. 4C, in the step of forming the first contact hole 103, patterning is performed using a desired mask to form the first contact hole 103 having a thickness (diameter) of 50 to 300 nm which penetrates the first interlayer insulating layer 102 and extends to the first line 101. If the first line 101 has a smaller width than the width of the first contact hole 103, the area of contact between the first line 101 and the first contact plug 104 changes due to an impact of mask misalignment, which causes, for example, variations in cell current. From the perspective of preventing this, the width of the first line 101 is set to be larger than the size of the first contact hole 103 in this embodiment.

Figure 4D:
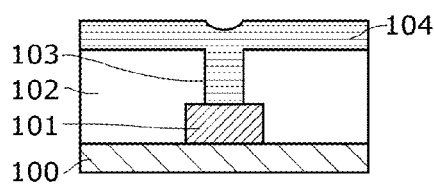
FIG. 4D shows a step in the method of manufacturing the nonvolatile memory element according to the first embodiment of the present invention.

Next, as shown in FIG. 4D, in the step of forming the first contact plug 104, first, as lower layers, Ti/TiN layers functioning as an adhesive layer and a diffusion barrier and each having a thickness of 5 to 30 nm are deposited in a sputtering method, and then, as an upper layer, 200 to 400 nm of tungsten (W) which will be the primary component of the contact plug is deposited in a chemical vapor deposition (CVD) method. At this time, the first contact hole 103 is filled up with a conductive layer having a laminated structure (W/Ti/TiN laminated structure) which will eventually be the first contact plug 104.

Figure 4E:
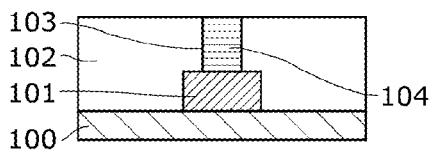
FIG. 4E shows a step in the method of manufacturing the nonvolatile memory element according to the first embodiment of the present invention.

Next, as shown in FIG. 4E, in the step of forming the first contact plug 104, the entire surface of the wafer is planarized and polished using a chemical mechanical polishing (CMP) method to remove unnecessary part of the conductive layer on the first interlayer insulating layer 102, which results in the first contact plug 104 formed in the first contact hole 103.

Figure 4F:
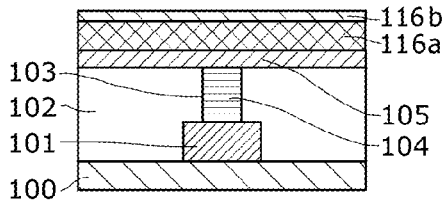
FIG. 4F shows a step in the method of manufacturing the nonvolatile memory element according to the first embodiment of the present invention.

Next, as shown in FIG. 4F, in the step of forming the lower electrode 105 and the variable resistance layer 116, a 20 to 100 nm-thick conductive layer comprising tantalum nitride or the like, which will eventually be the lower electrode 105, is formed, using a sputtering method, on the first interlayer insulating layer 102 so as to cover the first contact plug 104. Although the conductive layer is formed here using the sputtering method only, it is also possible to planarize the lower electrode using a CMP method additionally after the formation of the conductive layer. Subsequently, the second transition metal oxide 116a is formed on the lower electrode 105. Here, TaO$_{x2}$ that is the second transition metal oxide 116a was formed using what is called a reactive sputtering method in which a tantalum target is sputtered in the argon and oxygen gas atmosphere. In this case, an oxygen content atomic percentage effective in causing a change in resistance is 55 to 65 atm % (where x2 is 1.22 to 1.86), its resistivity is 1 to 50 m$\Omega$·cm, and its layer thickness is 20 to 100 nm. Subsequently, the first variable resistance layer 1161 comprising the first transition metal oxide 116b is formed on the second transition metal oxide 116a. Similarly to the second transition metal oxide 116a, TaO$_{x1}$ that is the first transition metal oxide 116b was formed in the reactive sputtering method in which a tantalum target is sputtered in the oxygen gas atmosphere. In this case, when stacked on the second transition metal oxide 116a, an oxygen content atomic percentage effective in causing a change in resistance is 68 to 71 atm % (where x1 is greater than 2.1), its resistivity is 1E+7 mΩ·cm or more, and its layer thickness is 3 to 10 nm. Although the first variable resistance layer 1161 was formed using the reactive sputtering method, it may also be possible that the surface layer of the second transition metal oxide 116a is oxidized using plasma oxidation to form the first transition metal oxide 116b having a high oxygen content atomic percentage. With the sputtering method, it is difficult to provide the transition metal oxide with oxygen of its stoichiometric composition (that is $Ta_2O_5$ in the case of tantalum oxide) or more, but a plasma oxidation process allows oxygen to be diffused into grain boundaries, flaws, and the like of the tantalum oxide, which results in a transition metal oxide having a higher oxygen content atomic percentage that is effective in reducing the leak current. In forming the first variable resistance layer 1161, it is also possible to employ a reactive sputtering method in which a tantalum oxide target is sputtered in the oxygen gas atmosphere.

Figure 4G:
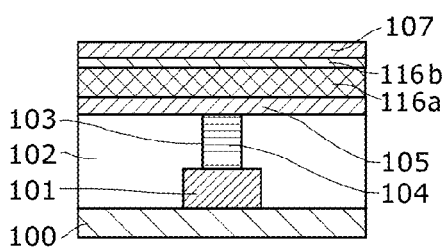
FIG. 4G shows a step in the method of manufacturing the nonvolatile memory element according to the first embodiment of the present invention.

Next, as shown in FIG. 4G, in the step of forming the upper electrode 107, a conductive layer comprising a noble metal (such as Pt, Ir, or Pa) or the like which will be the upper electrode 107 after patterning is formed on the first variable resistance layer 1161.

Figure 4H:
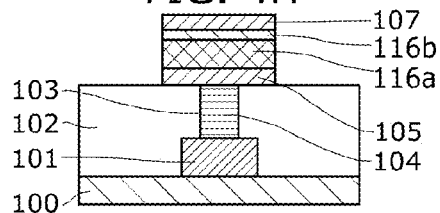
FIG. 4H shows a step in the method of manufacturing the nonvolatile memory element according to the first embodiment of the present invention.

Next, as shown in FIG. 4H, in the step of forming the variable resistance element 15, the lower electrode 105, the second transition metal oxide 116a, the first variable resistance layer 1161, and the upper electrode 107 are patterned using a mask to form a structure in which the second transition metal oxide 116a and the first variable resistance layer 1161 are located between the lower electrode 105 and the upper electrode 107. Since noble metals representing materials having high standard electrode potentials are difficult to etch, the variable resistance element 15 may be formed using such a noble metal as a hard mask in the case where the upper electrode comprises the noble metal. Although the patterning was collectively performed using the same mask in this step, the patterning may be performed for each step.

Figure 4I:
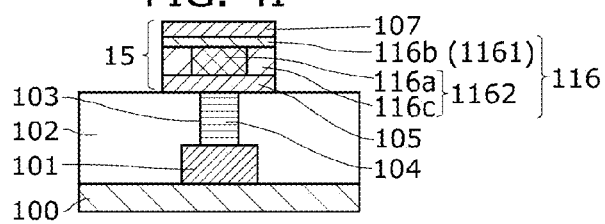
FIG. 4I shows a step in the method of manufacturing the nonvolatile memory element according to the first embodiment of the present invention.

Next, as shown in FIG. 4I, in the step of forming the transition metal compound 116c, using plasma nitridation, rapid thermal nitridation (RTN), or fluorine excitation plasma exposure, the transition metal compound 116c containing either oxygen and nitrogen or oxygen and fluorine is formed on a lateral side of the second transition metal oxide 116a exposed after the above patterning. Specifically, the nitridation or fluorination of the exposed lateral side of the second transition metal oxide 116a results in the second transition metal oxide 116a formed in the central region of the second variable resistance layer 1162 and results in the transition metal compound 116c formed in the peripheral region of the second variable resistance layer 1162.

The following shall describe the reason why the transition metal compound 116c contains either oxygen and nitrogen or oxygen and fluorine instead of being a transition metal oxide which contains oxygen only.

In general, a transition metal oxide (for example, the second transition metal oxide 116a) included in a variable resistance layer (that is the variable resistance layer 116 herein) has many dangling bonds, and when these dangling bonds are terminated by oxygen, the volume increases by what is called oxidation.

Accordingly, when, for example, in the manufacturing process shown in FIG. 4I, the transition metal oxide in the peripheral region of the second variable resistance layer 1162 is oxidized to form a transition metal oxide 116x instead of the transition metal compound 116c, the volume of the transition metal oxide 116x increases more as compared to the second transition metal oxide 116a, which leads to compressive stress on the upper electrode 107. Especially, when the upper electrode 107 comprises a material having a high Young's modulus, stress relaxation owing to plastic deformation is not likely, which causes separation on a face on which the upper electrode 107 and the variable resistance layer 116 are in contact with each other. This shall be described with reference to FIGS. 5A and 5B.

Figure 5A:
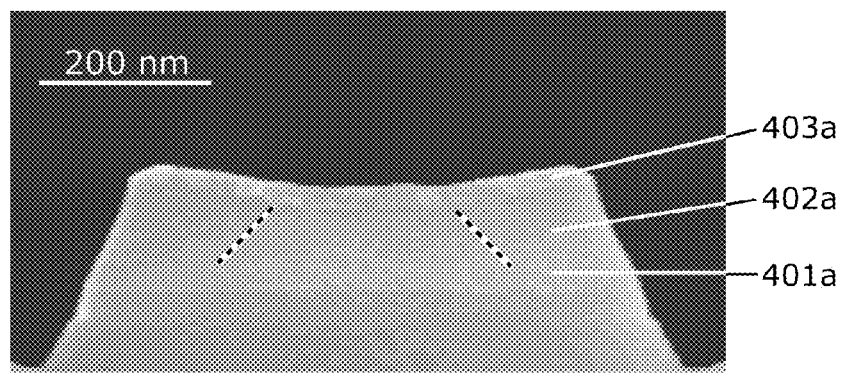
FIG. 5A shows an SEM image of a cross section of a variable resistance element with an upper electrode curved due to an increase in the volume of the variable resistance layer in a lateral side.
Figure 5B:
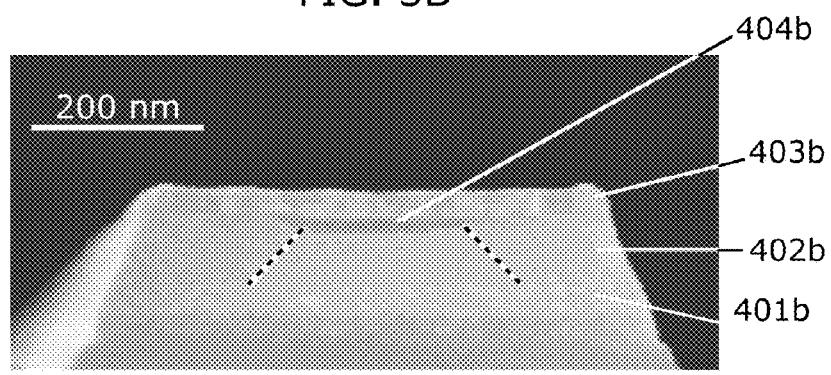
FIG. 5B shows an SEM image of a cross section of a variable resistance element with a variable resistance layer and an upper electrode which are separated from each other.

FIGS. 5A and 5B show scanning electron microscope (SEM) images of a cross section of the upper electrode which is under compressive stress in an experiment conducted by the inventors. FIG. 5A shows an SEM image of a cross section of the variable resistance layer comprising the transition metal oxide with the upper electrode curved due to an increase in the volume of the variable resistance layer which is caused by oxidation of the exposed lateral side of the variable resistance layer. In the structure shown in FIG. 5A, a resistance layer 402a, which comprises the transition metal oxide, and an upper electrode 403a are stacked on a lower electrode 401a. An exposed lateral side (which corresponds to the peripheral region of the second variable resistance layer 1162 in the above description) of the variable resistance layer 402a comprising the transition metal oxide is oxidized, which causes an increase in the volume in the lateral side and thus leads to compressive stress on the upper electrode 403a, with the result that the upper electrode 403a is curved into a concave shape. FIG. 5B shows an SEM image of a cross section in which separation occurs in part of a face on which an upper electrode and a variable resistance layer comprising the transition metal oxide are in contact with each other, due to further oxidation of the exposed lateral side of the variable resistance layer than in FIG. 5A. Specifically, in the structure shown in FIG. 5B, a variable resistance layer 402b, which comprises the transition metal oxide, and an upper electrode 403b are stacked on a lower electrode 401b as in the case of FIG. 5A. An exposed lateral side (which corresponds to the second transition metal oxide 116a in the peripheral region of the second variable resistance layer 1162 in the above description) of the variable resistance layer 402b is oxidized further and thus has a more increase in the volume in the lateral side than in FIG. 5A. As a result, the compressive stress on the upper electrode 403b is higher than that in FIG. 5A, which causes separation 404b in part of the face on which the variable resistance layer 402b and the upper electrode 403b are in contact with each other.

In other words, it is not favorable to only oxidize, without nitriding or fluorinating, the exposed lateral side of the second transition metal oxide 116a, to form a high-resistant transition metal oxide, because an increase in the volume due to oxidation of the exposed lateral side of the second transition metal oxide 116a may lead to not only compressive stress on the upper electrode 107, but also separation at the interface between the first variable resistance layer 1161 and the upper electrode 107.

From this perspective, in this embodiment, the exposed lateral side of the second transition metal oxide 116a is nitrided or fluorinated to form the transition metal compound 116c in the peripheral region of the second variable resistance layer 1162. Here, as shown in FIG. 2A, the second transition metal oxide 116a and the transition metal compound 116c have the same thickness. In the transition metal compound 116c formed here, nitrogen or fluorine is combined with a dangling bond present in the second transition metal oxide 116a, so that that the path of current flowing through the dangling bond can be interrupted, resulting in a resistance value of the transition metal compound 116c being higher than a resistance value of the second transition metal oxide 116a. Specifically, the resistivity of the transition metal compound 116c is greater than 50 mΩ·cm. In addition, the size of the transition metal compound 116c in the direction parallel to the principal surface of the substrate (that is (S1−S2)/2 in FIG. 2A) is in a range smaller than half the size of the variable resistance element 15 in the direction parallel to the principal surface of the substrate (that is S1/2 in FIG. 2A). Thus, the transition metal compound 116c having high resistivity is formed on the lateral side of the second transition metal oxide 116a having a low resistivity, which allows a reduction in the leak current from the second transition metal oxide 116a to the second interlayer insulating layer 108. It is to be noted that in the plasma nitridation, RTN, or fluorine plasma exposure used herein, the temperature range in the nitrogen or fluorine atmosphere was set to be 350 to 500 degrees Celsius. In the temperature range of 500 degrees Celsius or more, oxygen in the first transition metal oxide 116b is diffused to the second transition metal oxide 116a, which has a significant impact on resistance change characteristics of the element.

Figure 6:
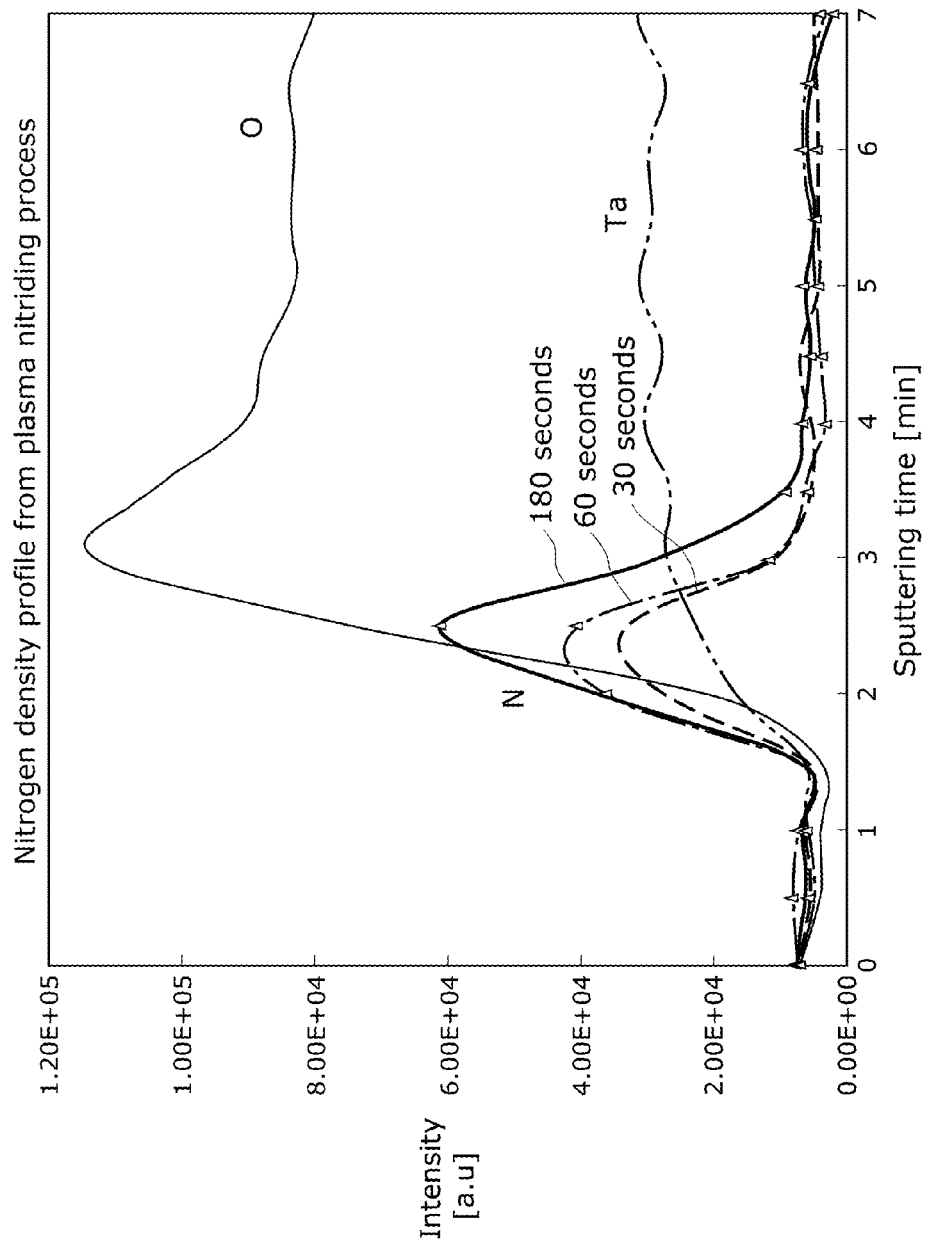
FIG. 6 shows a nitrogen density profile from a plasma nitriding process.

FIG. 6 shows a result of Auger electron spectroscopy (AES) analysis on a nitrogen density profile (nitrogen density distribution) from a plasma nitriding process. The horizontal axis represents a relative depth in sputtering time, and the vertical axis represents signal intensity (in a given unit of measure) for each element. FIG. 6 shows that, after formation of the $TaO_x$ film, performing the plasma nitriding process (30 seconds, 60 seconds, and 180 seconds) on a surface of the $TaO_x$ film by plasma nitridation can cause nitrogen to enter the TaON film to from the TaON film. In short, FIG. 6 shows that the TaON film can also be formed on the lateral side of the element from which the $TaO_x$ film is exposed. Thus, it can be seen that the use of the plasma nitridation or the like makes it possible to form the transition metal compound 116c which contains oxygen and nitrogen in the lateral side of the second transition metal oxide 116a.

Figure 7:
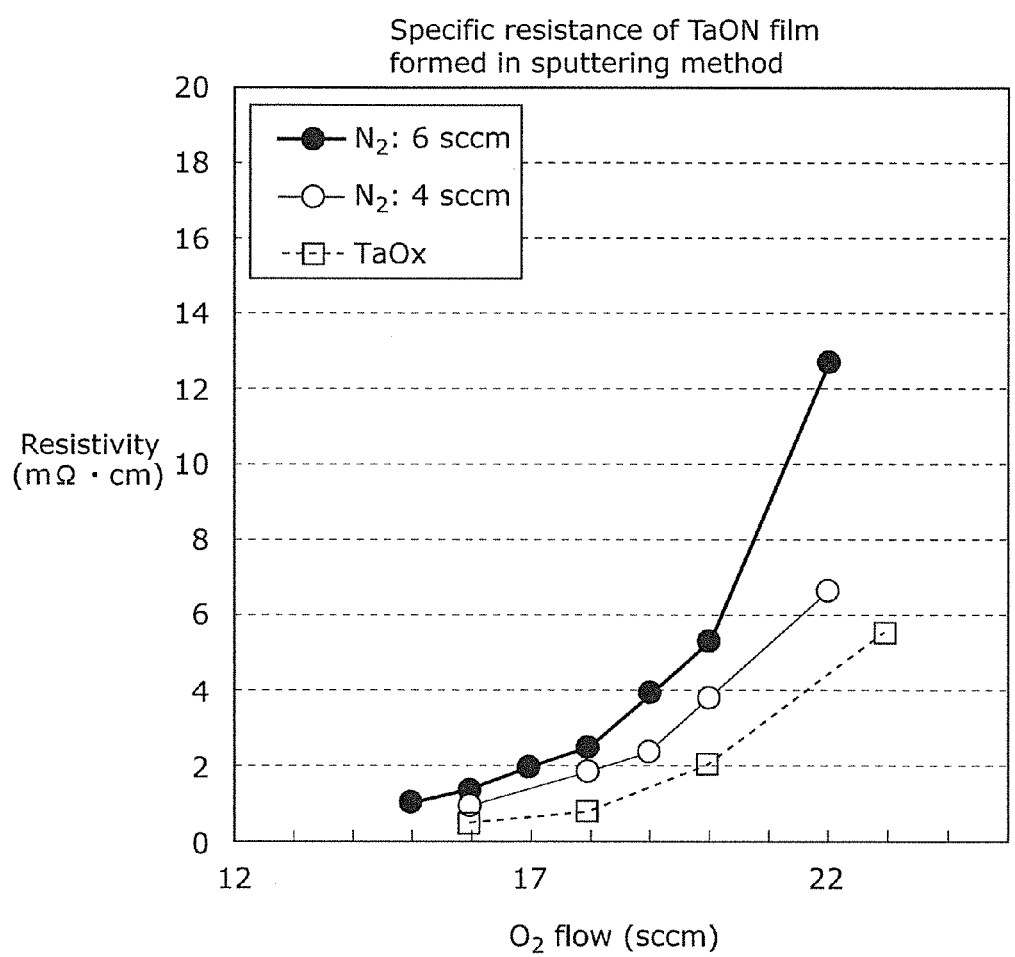
FIG. 7 shows specific resistance of a TaON film formed in a sputtering method.

The following shall describe that the transition metal compound 116c containing nitrogen exhibits high resistivity. FIG. 7 shows specific resistance of the TaON film formed in a sputtering method. The vertical axis represents specific resistance values (where the unit of measure is mΩ·cm), and the horizontal axis represents a flow of oxygen flowing at the time of film formation (that is, sputtering herein). As can be seen from FIG. 7, the TaON film formed with nitrogen of 4 sccm or 6 sccm mixed in at the time of film formation exhibits high resistivity as compared to $TaO_x$ formed without nitrogen mixed in at the time of film formation, even with the same oxygen flow rate. This is presumably because mixing nitrogen at the time of $TaO_x$ film formation causes nitrogen to be combined with a dangling bond of the $TaO_x$ film, which increases the resistivity.

Figure 8:
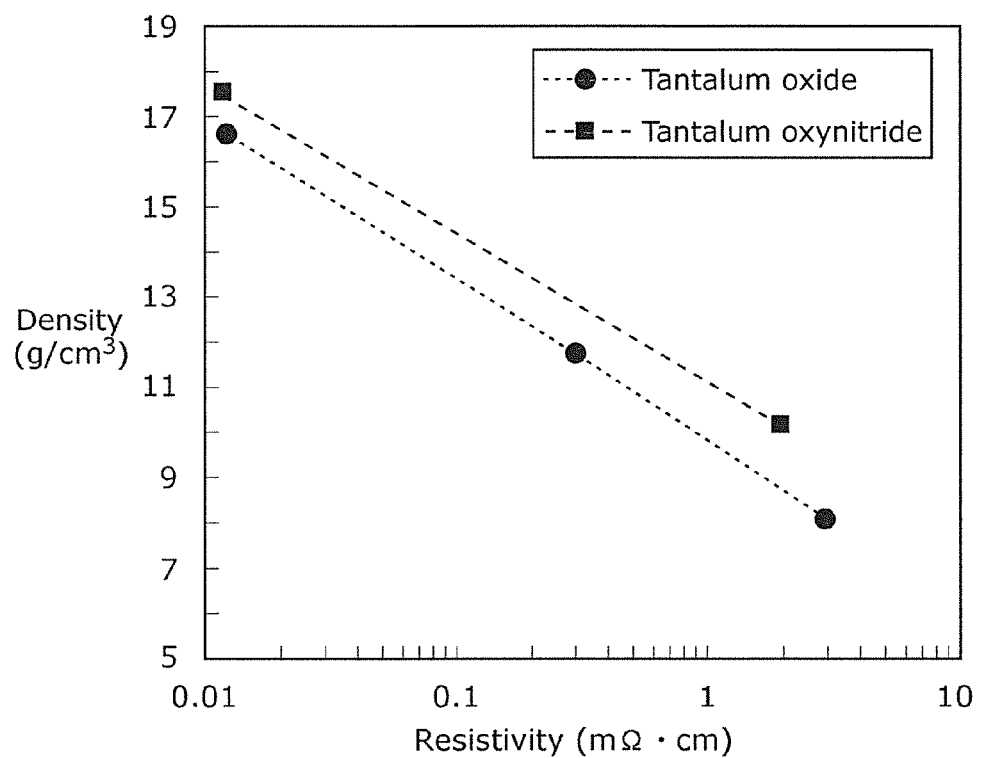
FIG. 8 shows characteristics of compared dependencies of density and resistivity between tantalum oxide and tantalum oxynitride.

In addition, the following shall describe that the transition metal compound 116c containing nitrogen exhibits high density as compared to a transition metal compound containing oxygen only (that is, a transition metal compound only oxidized). FIG. 8 shows comparison of density between tantalum oxide and tantalum oxynitride. The vertical axis represents density values calculated by Rutherford backscattering spectrometry (RBS), and the horizontal axis represents resistivities calculated from sheet resistance values and thicknesses. As shown in FIG. 8, tantalum oxynitride clearly has higher density and a smaller increase in the volume as compared to tantalum oxide with the same resistivity. This indicates, from FIG. 8, that the transition metal compound 116c containing nitrogen exhibits high density and a smaller increase in the volume, as compared to a transition metal compound containing oxygen only (that is, a transition metal compound only oxidized). Likewise, since fluorine has a higher electronegativity and a smaller atomic radius than those of oxygen, fluorinating an oxygen-deficient transition metal oxide causes fluorine to be combined with a dangling bond of a transition metal included in the oxygen-deficient transition metal oxide, presumably resulting in a transition metal oxidized and fluorinated layer which has low volumetric expansion and high resistance, as compared to the case of oxidizing an oxygen-deficient transition metal oxide. Thus, in this embodiment, the exposed lateral side of the second transition metal oxide 116a is nitrided or fluorinated to form the transition metal compound 116c in the peripheral region of the second variable resistance layer 1162, which makes it possible to reduce the volume increase and reduce the separation at the interface between the upper electrode and the variable resistance layer, as compared to the case where a transition metal oxide is formed in the peripheral region of the second variable resistance layer 1162.

The following shall continue to describe the manufacturing method.

Figure 4J:
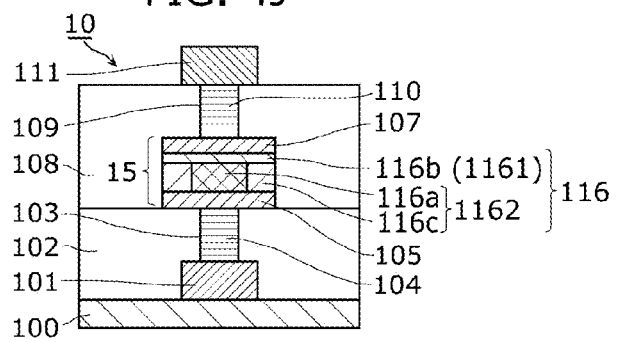
FIG. 4J shows a step in the method of manufacturing the nonvolatile memory element according to the first embodiment of the present invention.

At the end, as shown in FIG. 4J, the second interlayer insulating layer 108 having a thickness of 500 to 1000 nm is formed so as to cover the variable resistance layer 116, and in the same manufacturing method as shown in FIGS. 4B and 4C, the second contact hole 109 and the second contact plug 110 are formed. The second line 111 is then formed to cover the second contact plug 110, which completes the nonvolatile memory element 10.

The above manufacturing method makes it possible to form the transition metal compound 116c having high resistivity on the lateral side (i.e., the peripheral region) of the second variable resistance layer 1162. With this, the area of a contact region S2 between the variable resistance layer 1161 and the second transition metal oxide 116a located in the central region of the second variable resistance layer 1162 and having lower resistivity can be smaller than the area of the region S1 of the upper electrode 107, resulting in an increase in the density of current flowing to the second transition metal oxide 116a, which can facilitate formation of a conductive path in the first transition metal oxide 116b. Furthermore, the lateral side (the peripheral region) of the second variable resistance layer 1162 is nitrided or fluorinated to form the transition metal compound 116c in the periphery of the second transition metal oxide 116a, which makes it possible to reduce the volume increase in the lateral side (the peripheral region) of the second variable resistance layer 1162 and reduce the separation at the interface between the first variable resistance layer 1161 and the upper electrode 107, as compared to the case where the lateral side (the peripheral region) of the second variable resistance layer 1162 is oxidized.

In addition, performing nitridation or fluorination instead of oxidization in the step of forming the transition metal compound 116c in the periphery of the second transition metal oxide 116a will also produce an advantageous effect on the problem of a margin of the alignment between the element and the contact plug being diminished along with the recent miniaturization of the element. This shall be described below.

Figure 9:
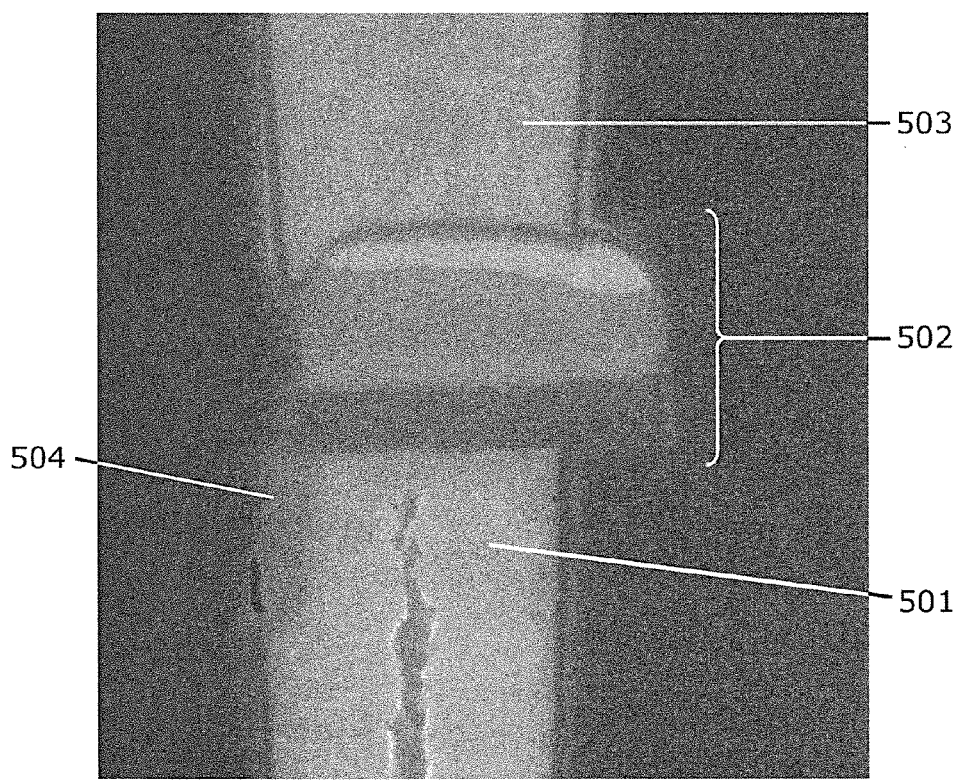
FIG. 9 shows an SEM image of a cross section of a variable resistance element with a contact plug partially oxidized due to misalignment of the contact plug and the variable resistance element.
Figure 10:
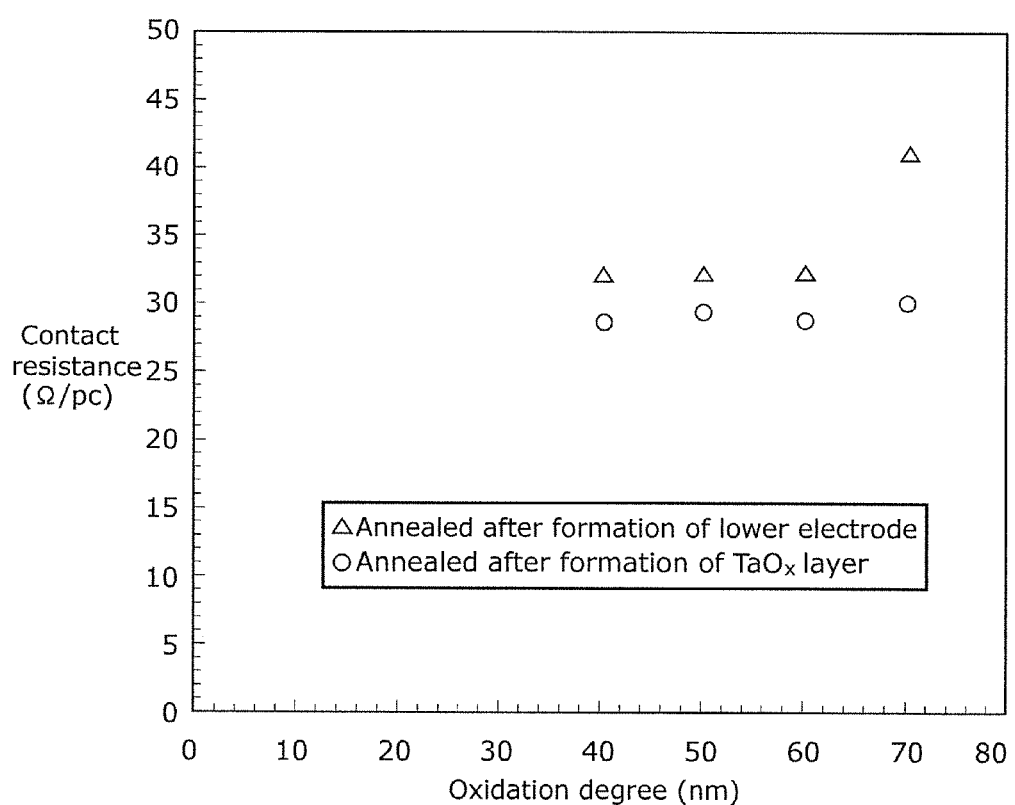
FIG. 10 shows contact resistance measured in the case where a contact plug is partially exposed and oxidized.

There is a case where the miniaturization of the element diminishes a margin of the alignment between the variable resistance element and the contact plug and exposes part of the contact plug from the lower-layer line. In particular, when the contact plug comprises tungsten, the part exposed due to misalignment is oxidized, resulting in oxidized tungsten, which is an insulator, which causes a problem of an increase in the contact resistance. FIG. 9 shows an SEM image of a cross section in which oxide has been formed in part of tungsten serving as a tungsten plug. In FIG. 9, a variable resistance element 502 is connected to a first contact plug 501 in contact with the lower-layer line and to a second contact plug 503 in contact with the upper-layer line. The first contact plug 501 comprises tungsten, in part of which tungsten oxide 504 is formed. This tungsten oxide 504 is formed from part of the first contact plug 501 exposed due to misalignment between the variable resistance element 502 and the first contact plug 501 when the part is oxidized in a subsequent process such as the oxidization of a transition metal oxide or the formation of an interlayer insulating layer. FIG. 10 shows contact resistance measured in the case where the contact plug is partially exposed and oxidized. The vertical axis represents contact resistance values ($\Omega$/pc) per contact plug, and the horizontal axis represents, as an oxidation degree (where the unit of measure is nm), a thickness of an oxide (that is the tungsten oxide herein) of a material of the contact plug. Here, a circle indicates a contact resistance value obtained when, after patterning of the $TaO_x$ layer which is a variable resistance film, annealing has been performed without the TaN film patterned which is the lower electrode, and a triangle indicates a contact resistance value obtained when annealing has been performed after patterning up to the TaN film which is the lower electrode and thus forming the miniaturized element according to an implementation of the present invention which has a reduced margin of alignment between the variable resistance element and the contact plug. As shown in FIG. 10, it can be found that, as a result of patterning up to the lower electrode, an increase in the oxidation degree causes a non-negligible increase in the resistance value, which is attributed to the oxide formed in the contact plug, due to misalignment between the variable resistance element and the contact plug. In other words, the miniaturization of the element makes misalignment between the variable resistance element and the contact plug more likely, which results in oxidation of the exposed surface and lateral side of the contact plug and thus increases the contact resistance.

From this perspective, in this embodiment, the exposed lateral side of the second transition metal oxide 116a is nitrided or fluorinated. Accordingly, the exposed surface of the contact plug is nitrided or fluorinated to form tungsten nitride or tungsten fluoride that has conductive properties. This means that even when there is an exposed tungsten plug, a surface of the contact plug can be prevented from oxidation because conductive tungsten nitride or fluoride is formed.

Figure 11A:
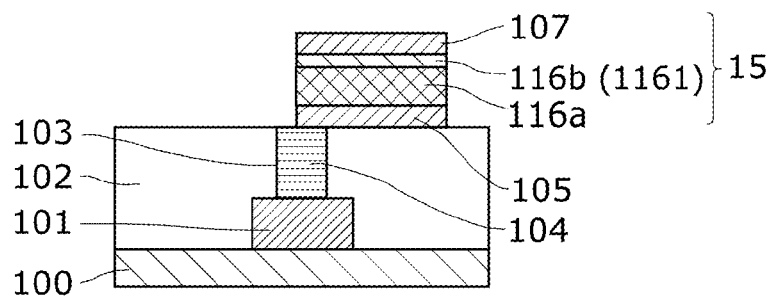
FIG. 11A shows a step in the method of manufacturing the nonvolatile memory element according to the first embodiment of the present invention.
Figure 11B:
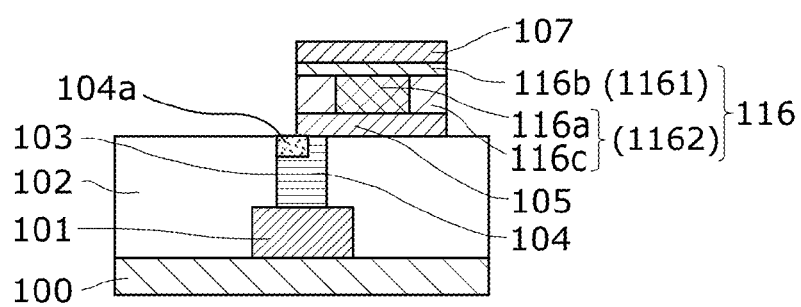
FIG. 11B shows a step in the method of manufacturing the nonvolatile memory element according to the first embodiment of the present invention.
Figure 11C:
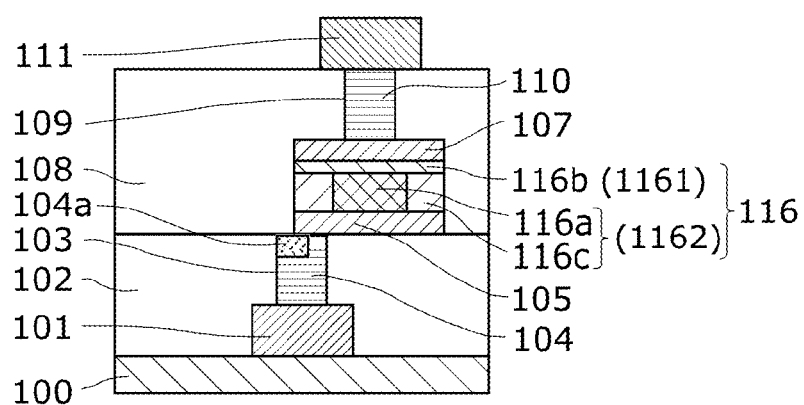
FIG. 11C shows a step in the method of manufacturing the nonvolatile memory element according to the first embodiment of the present invention.

With reference to FIGS. 11A to 11C, the following describes a specific case where the first contact plug 104 in FIG. 4H has a partially exposed surface due to misalignment between the first contact plug 104 and the variable resistance element 15.

FIG. 11A corresponds to the step of FIG. 4H. The steps of FIGS. 4A to 4G are as described above and therefore are not described here. Specifically, in the step of forming the variable resistance element 15, the lower electrode 105, the second transition metal oxide 116a, the first variable resistance layer 1161, and the upper electrode 107 are patterned using a mask to form a structure in which the second transition metal oxide 116a and the first variable resistance layer 1161 are located between the lower electrode 105 and the upper electrode 107. At this time, as shown in FIG. 11A, the variable resistance element 15 and the first contact plug 104 are misaligned, exposing part of a surface of the first contact plug 104.

Next, in the step of forming the transition metal compound 116c in FIG. 11B which corresponds to the step of FIG. 4I, using the plasma nitridation, the RTN, or the fluorine plasma exposure, the transition metal compound 116c containing either oxygen and nitrogen or oxygen and fluorine is formed on the lateral side of the second transition metal oxide 116a exposed after the above patterning. Specifically, the nitridation or fluorination of the exposed lateral side of the second transition metal oxide 116a results in the second transition metal oxide 116a formed in the central region of the second variable resistance layer 1162 and results in the transition metal compound 116c formed in the peripheral region of the second variable resistance layer 1162. At this time, as shown in FIG. 11B, tungsten nitride or tungsten fluoride 104a is formed on the exposed surface part of the first contact plug 104 formed in FIG. 11A. Here, tungsten nitride or tungsten fluoride has conductive properties and therefore does not increase the contact resistance (that is, does not cause contact failures). Especially, tungsten nitride has specific resistance of approximately 135 $\mu\Omega$·cm, which provides the feature of preventing oxygen diffusion. It is to be noted that, when oxidation is performed instead of nitridation or fluorination in the step of FIG. 11B, tungsten oxide is formed in the exposed surface part of the first contact plug 104 as described with reference to FIG. 9. Since tungsten oxide is an insulator, there is a possibility of a contact failure occurring.

Figure 12:
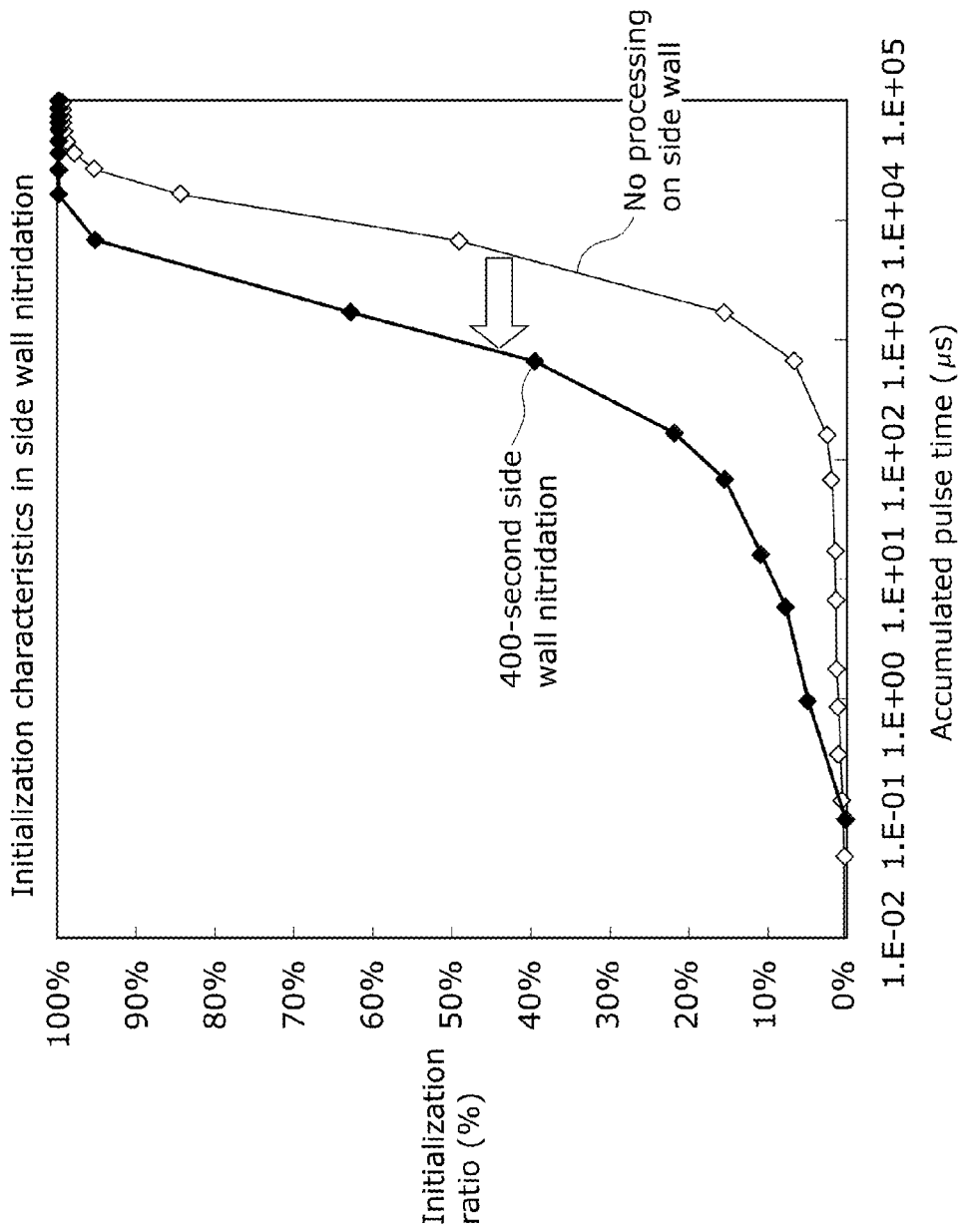
FIG. 12 shows initialization characteristics in side wall nitridation.

Next, in FIG. 11C which corresponds to the step of FIG. 4J, the second interlayer insulating layer 108 having a thickness of 500 to 1000 nm is formed so as to cover the variable resistance layer 116, and in the same manufacturing method as shown in FIGS. 4B and 4C, the second contact hole 109 and the second contact plug 110 are formed. The second line 111 is then formed to cover the second contact plug 110, which completes the nonvolatile memory element 10. Since the tungsten nitride 104a formed in FIG. 11B has the feature of preventing oxygen diffusion as described above, it is also possible to reduce the oxidation of the first contact plug 104 at the time of forming the second interlayer insulating layer 108. With this, the first contact plug 104 remains conductive even after the second interlayer insulating layer 108 is formed, so that the contact resistance does not increase and the contact failures are prevented. This way, it is possible to lower the initialization voltage for the variable resistance element 15, which can provide a nonvolatile memory element capable of initialization at low voltage. Furthermore, it is possible to suppress the formation of tungsten oxide which occurs due to misalignment with the contact plug, which can contribute to stabilization of the contact resistance. FIG. 12 shows initialization characteristics in side wall nitridation. The horizontal axis represents accumulated pulse time ($\mu$s) of voltage pulses applied for initialization, and the vertical axis represents an initialization ratio. As shown in FIG. 12, it can be found that when a side wall nitriding process is performed for 400 seconds, the accumulated pulse time is shorter and the initialization characteristics are better, as compared to the case where no side wall nitriding process is performed. In other words, FIG. 12 shows that, when the lateral side of the variable resistance element 15 is nitrided, a TaON region having high resistance is formed in the lateral side of the variable resistance element 15, and even when there is an exposed tungsten plug, the tungsten nitride 104a having conductive properties is formed. Furthermore, since the tungsten nitride 104a has the feature of preventing oxygen diffusion as described above, the oxidation of the first contact plug 104 is also reduced at the time of forming the second interlayer insulating layer 108, which presumably can lead to an improvement in the initialization characteristics as a whole.

According to this embodiment, it is thus possible to provide a nonvolatile memory element in which the initialization at low voltage is possible without forming hillocks at an interface between an electrode and a variable resistance film.

Moreover, this produces an effect of solving, at the same time, the problems in the manufacturing process, such as a reduction of the separation which is attributed to the volume increase caused by oxidation of the transition metal oxide, or prevention of oxidation of a surface of the contact plug exposed along with miniaturization of the element.

Furthermore, performing nitridation or fluorination instead of oxidization in the step of forming the transition metal compound 116c in the periphery of the second transition metal oxide 116a will also produce an advantageous effect on the problem of a decrease in an operation window of a memory element. This shall be described below.

Figure 13:
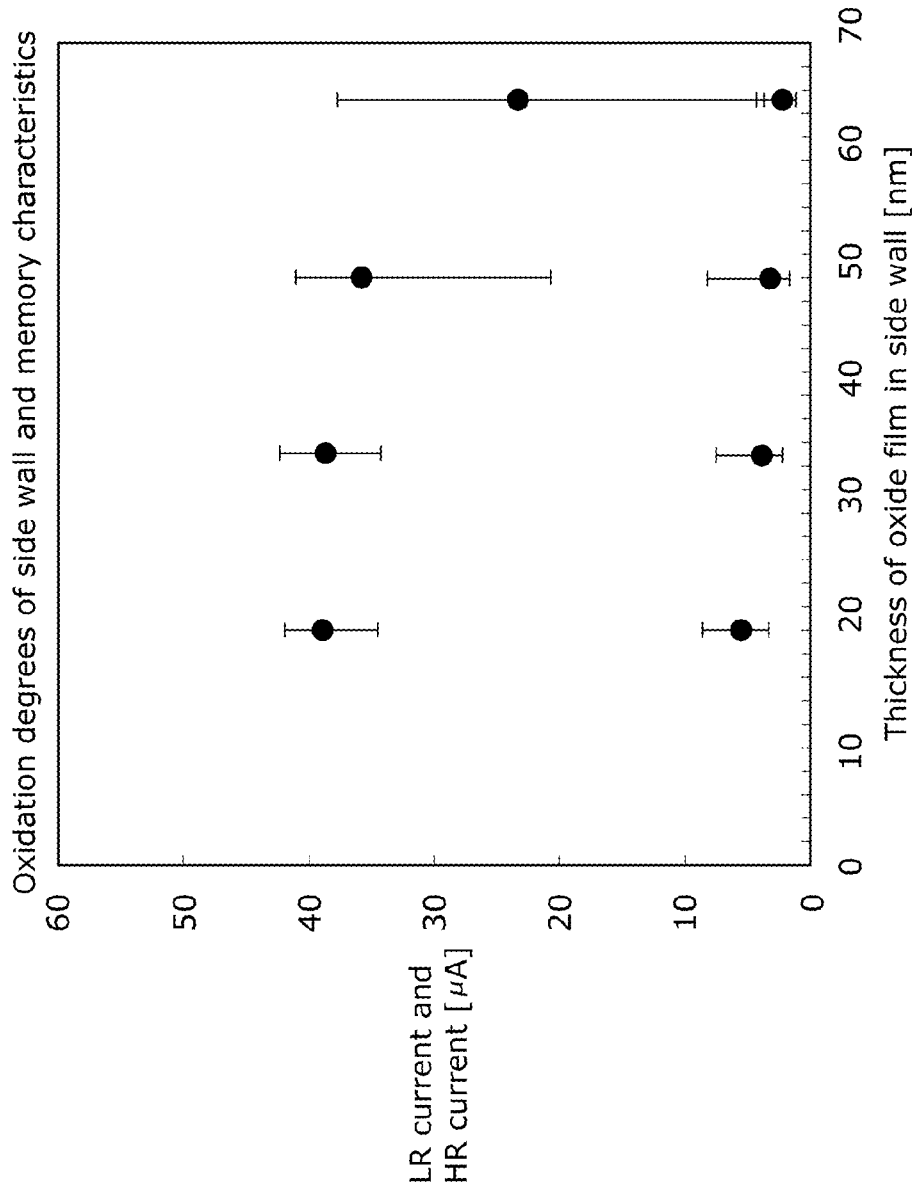
FIG. 13 shows oxidation degrees of a periphery region, i.e., a side wall, of the second transition metal oxide, and memory characteristics.

FIG. 13 shows a thickness of an oxide film in the side wall of the second transition metal oxide, and memory characteristics (current characteristics at the time of a change in resistance). The horizontal axis represents a thickness (where the unit of measure is nm) of an oxide film in the side wall, that is, of the transition metal oxide in the peripheral region of the second transition metal oxide, and the vertical axis represents low resistance (LR) current and high resistance (HR) current (where the unit of measure is μA). This means that the LR current and the HR current correspond to a small resistance value and a large resistance value, respectively. At each thickness of the oxide film in the side wall in FIG. 13, the distribution with a larger current value indicates LR current while the distribution with a smaller current value indicates HR current. Here, the low resistance (LR) means shifting the nonvolatile memory element (more accurately, the variable resistance element included in the nonvolatile memory element) from a high resistance state to a low resistance state while the high resistance (HR) means shifting the nonvolatile memory element (more accurately, the variable resistance element included in the nonvolatile memory element) from a low resistance state to a high resistance state.

As shown in FIG. 13, when forming the transition metal oxide in the periphery of the second transition metal oxide 116a, a margin (an operation window) between the distribution of low resistance (LR) current and the distribution of high resistance (HR) current decreases as the thickness of the oxide film in the side wall increases (there is a partial overlap in the distribution when the thickness of the oxide film in the side wall is large), which shows that the operation characteristics of the memory element are deteriorating. In other words, when forming a transition metal oxide in the periphery of the second transition metal oxide 116a in the oxidation step, an increase in the thickness of the oxide film in the side wall of the second transition metal oxide 116a leads to a decrease in the operation window of the memory element. This is presumably because excess oxygen which is contained in the transition metal oxide formed in the periphery (the side wall) of the second transition metal oxide 116a is diffused into the central region of the second transition metal oxide 116a, causing an increase in the oxygen density right below a filament which is formed at the time of initialization.

From this perspective, in this embodiment, the exposed lateral side of the second transition metal oxide 116a is nitrided or fluorinated to form the transition metal compound 116c in the peripheral region of the second variable resistance layer 1162. By so doing, it is presumed that the excess oxygen which is contained in the transition metal compound 116c formed in the periphery (the side wall) of the second transition metal oxide 116a is not diffused into the central region of the second transition metal oxide 116a, causing no change in the oxygen content of the second transition metal oxide 116a. In other words, there is an effect that the operation window of the memory element does not decrease even when the thickness of an oxynitride or oxyfluoride film in the side wall of the second transition metal oxide 116a increases in the case where the transition metal compound 116c is formed in the periphery of the second transition metal oxide 116a in the nitriding process.

Second Embodiment

Next, a nonvolatile memory element according to the second embodiment of the present invention is described.

[Structure]

Figure 14A:
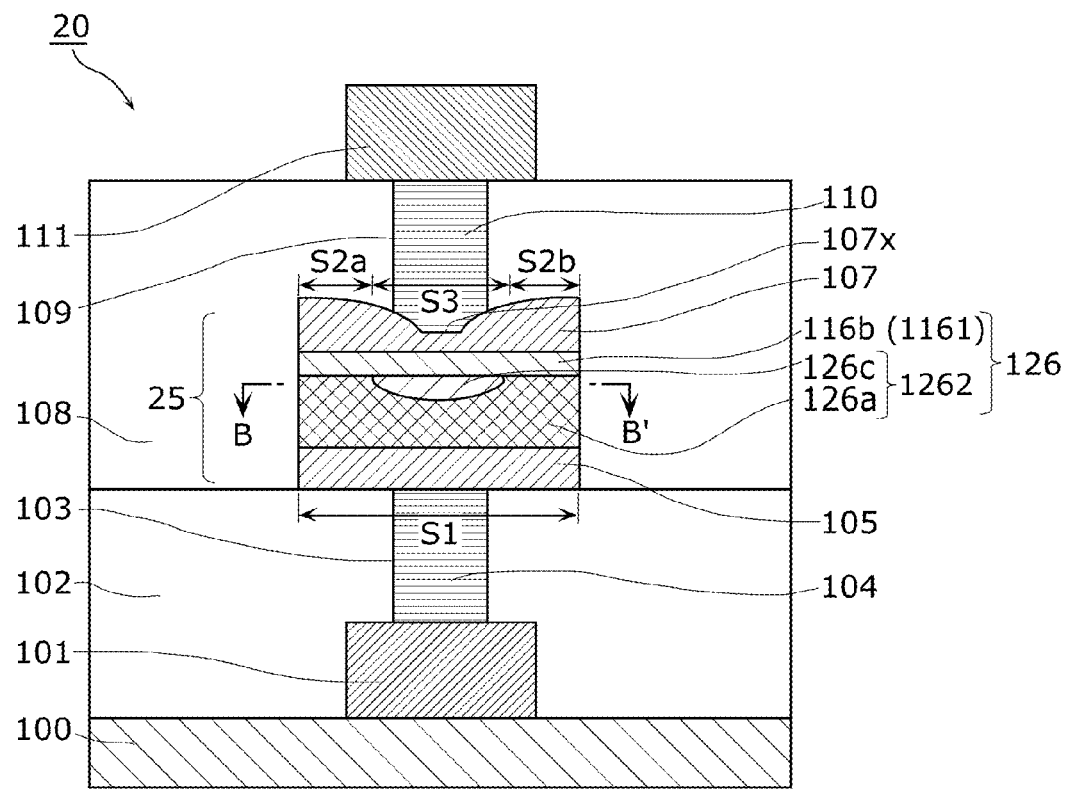
FIG. 14A is a cross-sectional view of a nonvolatile memory element according to the second embodiment of the present invention.
Figure 14B:
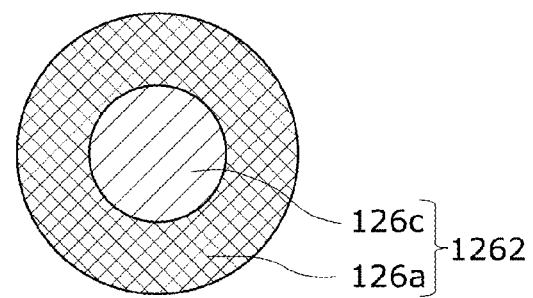
FIG. 14B shows a cross-sectional view taken along B-B' of FIG. 14A.

FIG. 14 is a cross-sectional view of a nonvolatile memory element 20 according to the second embodiment of the present invention. FIG. 14B shows a cross-sectional view taken along B-B' of FIG. 14A and viewed in the direction of the arrows. As shown in FIG. 14A, the nonvolatile memory element 20 according to this second embodiment is a variable resistance nonvolatile memory element and includes the substrate 100 comprising silicon (Si) or the like, the first line 101, the first interlayer insulating layer 102, the first contact plug 104, a variable resistance element 25, the second interlayer insulating layer 108, the second contact plug 110, and the second line 111.

The variable resistance element 25 includes the lower electrode 105, a variable resistance layer 126, and the upper electrode 107. The variable resistance layer 126 is a layer disposed between the lower electrode 105 and the upper electrode 107 and has a resistance value that reversibly changes based on electric signals applied between these electrodes (the lower electrode 105 and the upper electrode 107) (more specifically, this layer reversibly changes between a high resistance state and a low resistance state according to a polarity of voltage applied between these electrodes). The variable resistance layer 126 includes at least two layers: the first variable resistance layer 1161 comprising the first transition metal oxide 116b; and a second variable resistance layer 1262 comprising a second transition metal oxide 126a and a transition metal compound 126c. In FIG. 14A, the same constituents as those in FIG. 2A are denoted by the same numerals and therefore not described. In a practical structure of a memory cell using the nonvolatile memory element 20 according to this embodiment, one of the first line 101 and the second line 111 is connected to a switching element (i.e., a diode or a transistor) which is set to be ON when the cell is selected and be OFF when the cell is not selected. The connection to the switching element may be achieved by direct connection to the electrode (105 or 107) of the nonvolatile memory element not via the contact plug (104 or 110) or the line (101 or 111).

The nonvolatile memory element 20 according to this embodiment, shown in FIG. 14A, and the nonvolatile memory element 10 according to the first embodiment are different in structure of the second variable resistance layer 1262 (that is, the second transition metal oxide 126a and the transition metal compound 126c). Specifically, in the nonvolatile memory element 20 according to this embodiment, the transition metal compound 126c is disposed in part of the surface of the second variable resistance layer 1262 in contact with the first variable resistance layer 1161 and is located between the first variable resistance layer 1161 and the second transition metal oxide 126a. That is, as can be seen from the structure of the second variable resistance layer 1262 shown in FIGS. 14A and 14B, in the second variable resistance layer 1262 according to this embodiment, the second transition metal oxide 126a having a small resistance value is disposed in a peripheral region of a surface of the second variable resistance layer 1262 while the transition metal compound 126c having a large resistance value is disposed in a central region of the second variable resistance layer 1262. The transition metal compound 126c is in contact with at least part of the second face (that is the bottom surface herein) of the first variable resistance layer 1161, and the second transition metal oxide 126a is in contact with the remaining part of the second face (that is the bottom surface herein) of the first variable resistance layer 1161.

With such a structure, in regions S2a and S2b (that are actually connected to form a ring-shaped region), on a surface of the second variable resistance layer 1262, in which the transition metal compound 126c is not disposed, the first variable resistance layer 1161 and the second transition metal oxide 126a are located between the upper electrode 107 and the lower electrode 105, and in a region S3, on the surface of the second variable resistance layer 1262, in which the transition metal compound 126c is disposed, the first variable resistance layer 1161 and the second variable resistance layer 1262 comprising the second transition metal oxide 126a and the transition metal compound 126c are located between the upper electrode 107 and the lower electrode 105. In the region S3, the first transition metal oxide 116b and the transition metal compound 126c which have high resistivities are stacked in layers in which the total thickness of the transition metal oxide and the transition metal compound is larger than in the regions S2a and S2b, resulting in high resistance, and thus almost no current flow. Accordingly, most of the current inside the variable resistance element 25 passes through the regions S2a and S2b and thereby flows to the first transition metal oxide 116b, which can increase the density of current in the first transition metal oxide 116b in these regions and reduce the initialization voltage, with the result that the element can be initialized at low voltage. In other words, most of the current flowing in the second variable resistance layer 1262 comprising the second transition metal oxide 126a and the transition metal compound 126c will flow in the second transition metal oxide 126a having a small resistance value (i.e., the peripheral region of the second variable resistance layer 1262), which increases the density of current flowing from the second variable resistance layer 1262 to the first variable resistance layer 1161 and enables initialization of the variable resistance element 25 at lower voltage. Although the above describes how the density of current flowing from the second variable resistance layer 1262 to the first variable resistance layer 1161 increases, the same applies to the current flowing in the opposite direction (the current flowing from the first variable resistance layer 1161 to the second variable resistance layer 1262).

Furthermore, in this second embodiment, the areas of the regions S2a and S2b decrease depending not on the thickness of the transition metal compound 126c, but on the area of the region S3 in the plane direction of the transition metal compound 126c. Accordingly, the transition metal compound 126c in the second embodiment can be thinner than in the first embodiment, with the result that the volume increase along with formation of the transition metal compound 126c can be reduced, producing effects of a reduction in stress on the upper electrode and a reduction in film separation.

[Manufacturing Method]

Figure 15A:
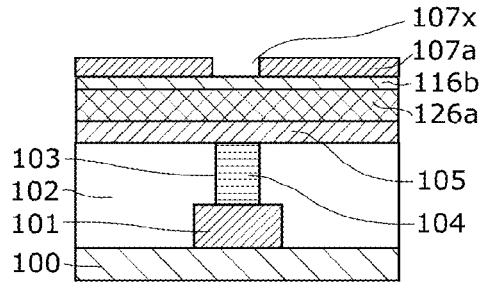
FIG. 15A shows a step in a method of manufacturing the nonvolatile memory element according to the second embodiment of the present invention.

FIGS. 15A to 15E show cross-sectional views of the nonvolatile memory element 20, to illustrate a method of manufacturing a major part thereof, according to the second embodiment of the present invention. With reference to these views, the method of manufacturing the major part of the nonvolatile memory element 20 according to this second embodiment is described. The steps before FIG. 15A are the same or alike as those in FIGS. 4A to 4E and therefore not described. Since the upper electrode 107 includes, from a manufacturing reason, two layers: a first upper electrode 107a; and a second upper electrode 107b, in this embodiment, the step of forming the upper electrode 107 in the first embodiment, shown in FIG. 4G, corresponds to the step of forming the first upper electrode 107a in this embodiment.

As shown in FIG. 15A, in the step of opening the first upper electrode 107a, the first upper electrode 107a is opened by patterning to expose the variable resistance layer 126. Although the first variable resistance layer 1161 (i.e., the first transition metal oxide 116b) is exposed herein, the first variable resistance layer 1161 (i.e., the first transition metal oxide 116b) may be penetrated so that the second variable resistance layer 1262 (i.e., the second transition metal oxide 126a herein) is exposed.

Figure 15B:
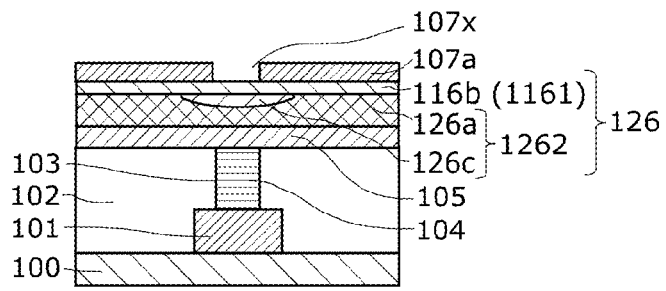
FIG. 15B shows a step in the method of manufacturing the nonvolatile memory element according to the second embodiment of the present invention.

Next, as shown in FIG. 15B, in the step of forming the transition metal compound 126c, the element is nitrided or fluorinated by the plasma nitridation, the RTN, or the fluorine plasma exposure so that nitrogen or fluorine enters from an opening region 107x of the first upper electrode 107a, passes through the first variable resistance layer 1161 (that is the first transition metal oxide 116b), and nitrides or fluorinates part of a surface of the second variable resistance layer 1262 (that is the second transition metal oxide 126a herein) to form the transition metal compound 126c. In other words, part of the surface of the second transition metal oxide 126a covered by the first variable resistance layer 1161 is nitrided together with the first variable resistance layer 1161 so as to form the transition metal compound 126c in the central region of the second variable resistance layer 1262 and form the second transition metal oxide 126a in the peripheral region of the second variable resistance layer 1262.

This results in a layout in which the transition metal compound 126c is located between the first variable resistance layer 1161 and the second transition metal oxide 126a. In the plasma nitridation, the RTN, or the fluorine plasma exposure performed herein, the temperature range in the nitrogen or fluorine atmosphere was set to be 350 to 500 degrees Celsius. At the temperature of 500 degrees Celsius or more, oxygen in the first transition metal oxide 116b is diffused to the second transition metal oxide 126a, which has a significant impact on resistance change characteristics of the element. At the temperature of 500 degrees Celsius or less, the noble metal, such as Pt or Ir, that is an electrode material for the first upper electrode 107a is not nitrided or fluoridated. Accordingly, the noble metal assumes a role as a hard mask in forming the transition metal compound 126c. The properties (material, oxygen content atomic percentage, and resistivity) of the transition metal compound 126c thus formed are the same or alike as those of the transition metal compound 116c according to the first embodiment. It is sufficient for the transition metal compound 126c to have a thickness of 1 nm or more, more desirably, 5 nm or more, because the purpose is to form a high resistance region in the region S3 and thereby make it difficult for the current to flow. Furthermore, the transition metal compound 126c desirably has insulation properties.

Figure 15C:
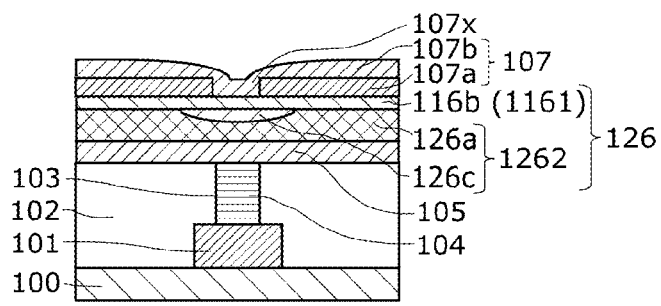
FIG. 15C shows a step in the method of manufacturing the nonvolatile memory element according to the second embodiment of the present invention.

Next, as shown in FIG. 15C, in the step of forming the second upper electrode 107b, the same noble metal as the first upper electrode 107a is deposited in a sputtering method to cover the opening region 107x. Although the same noble metal as the first upper electrode 107a was deposited as the second upper electrode 107b herein, a different metal (such as TiN, Ta, and TiAlN) may be used.

Figure 15D:
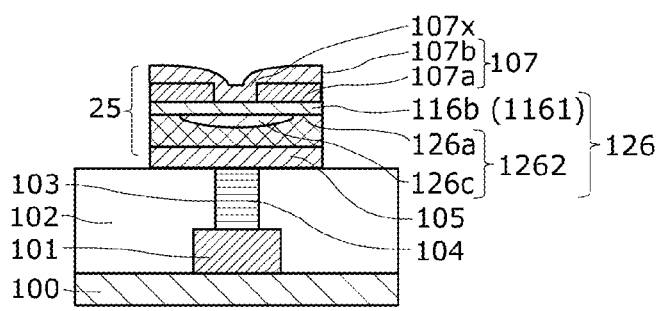
FIG. 15D shows a step in the method of manufacturing the nonvolatile memory element according to the second embodiment of the present invention.

Next, as shown in of FIG. 15D, in the step of forming the variable resistance element 25, the patterning is performed to make the variable resistance element 25 into a desired size.

Figure 15E:
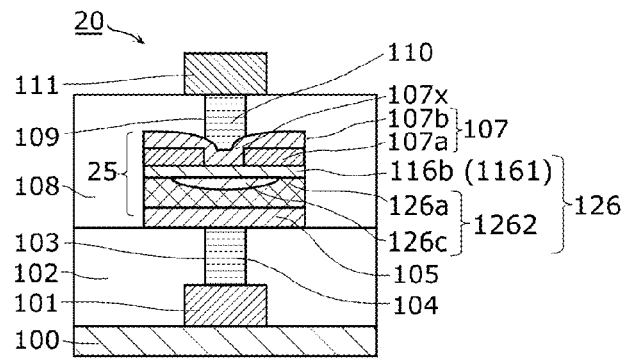
FIG. 15E shows a step in the method of manufacturing the nonvolatile memory element according to the second embodiment of the present invention.

At the end, as shown in FIG. 15E, the second interlayer insulating layer 108 having a thickness of 500 to 1000 nm is formed so as to cover the variable resistance layer 126, and in the same manufacturing method as shown in FIGS. 4B and 4C, the second contact hole 109 and the second contact plug 110 are formed. The second line 111 is then formed to cover the second contact plug 110, which completes the nonvolatile memory element 20.

With the above manufacturing method, as compared to the region S3 (i.e., the contact region between the transition metal compound 126c and the first variable resistance layer 1161), located in the central region of the second variable resistance layer 1262, in which the transition metal compound 126c is disposed, the regions S2a and S2b (i.e., the contact region between the second transition metal oxide 126a and the first variable resistance layer 1161) of the second transition metal oxide 126a located in the peripheral region of the second variable resistance layer 1262 have a thin layer of the transition metal oxide having high resistivity and therefore has low resistance, which allows current to more easily flow and increases the density of current. This way, the formation of a conductive path in the first transition metal oxide 116b can be facilitated and the initialization voltage of the variable resistance element 25 can be reduced, resulting in a nonvolatile memory element which can be initialized at low voltage Third Embodiment Next, a nonvolatile memory element according to the third embodiment of the present invention is described.

[Structure]

Figure 16:
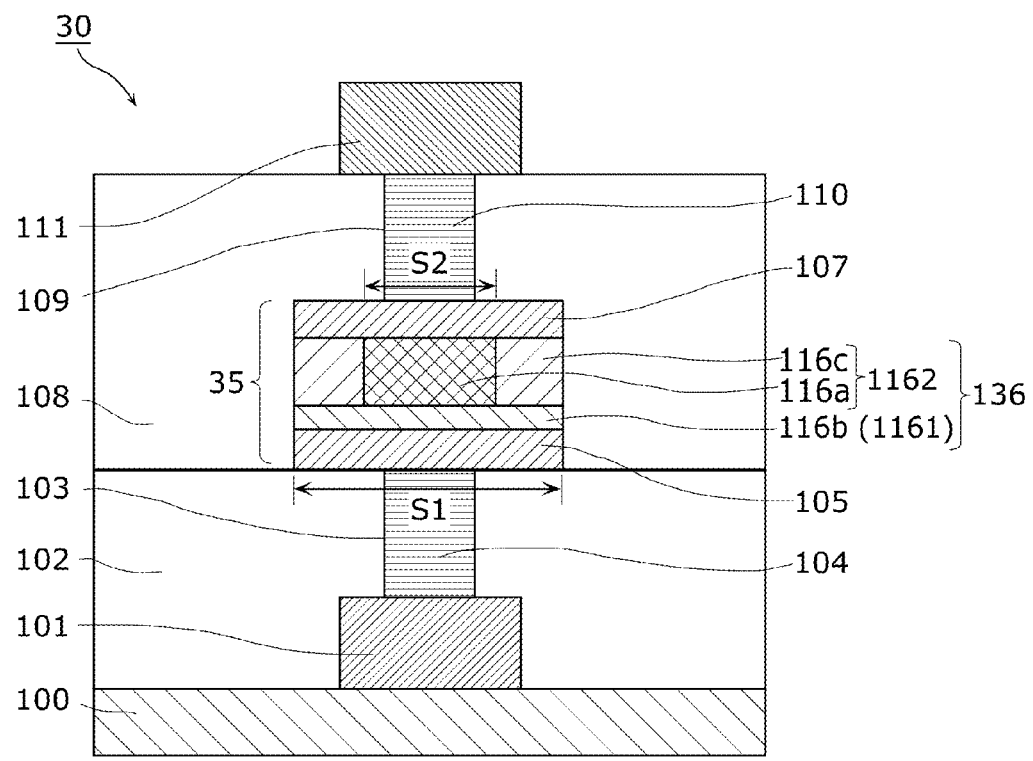
FIG. 16 is a cross-sectional view of a nonvolatile memory element according to the third embodiment of the present invention.

FIG. 16 is a cross-sectional view of a nonvolatile memory element 30 according to the third embodiment of the present invention. As shown in FIG. 16, the nonvolatile memory element 30 according to this embodiment is a variable resistance nonvolatile memory element and includes the substrate 100 comprising silicon (Si) or the like, the first line 101, the first interlayer insulating layer 102, the first contact plug 104, a variable resistance element 35, the second interlayer insulating layer 108, the second contact plug 110, and the second line 111. The variable resistance element 35 includes the lower electrode 105, a variable resistance layer 136, and the upper electrode 107. The variable resistance layer 136 is a layer disposed between the lower electrode 105 and the upper electrode 107 and has a resistance value that reversibly changes based on electric signals applied between these electrodes (the lower electrode 105 and the upper electrode 107) (more specifically, this layer reversibly changes between a high resistance state and a low resistance state according to a polarity of voltage applied between these electrodes: the lower electrode 105 and the upper 107), and includes at least two layers: the first variable resistance layer 1161 comprising the first transition metal oxide 116b; and the second variable resistance layer 1162 comprising the second transition metal oxide 116a and the transition metal compound 116c. In FIG. 16, the same constituents as those in FIG. 2A are denoted by the same numerals and therefore not described. In a practical structure of a memory cell using the nonvolatile memory element according to this embodiment, one of the first line 101 and the second line 111 is connected to a switching element (i.e., a diode or a transistor) which is set to be OFF when the cell is not selected. The connection to the switching element may be achieved by direct connection to the electrode (105 or 107) of the nonvolatile memory element not via the contact plug (104 or 110) or the line (101 or 111).

As shown in FIG. 16, the nonvolatile memory element 30 according to this embodiment and the nonvolatile memory element 10 according to the first embodiment are different in positions of the first variable resistance layer 1161 comprising the first transition metal oxide 116b, and the second variable resistance layer 1162 comprising the second transition metal oxide 116a and the transition metal compound 116c. Specifically, in the nonvolatile memory element 30, the second variable resistance layer 1162 is disposed on the first variable resistance layer 1161, thereby forming the variable resistance layer 136. In other words, the transition metal compound 116c is in contact with at least part of the second face (that is the top surface herein) of the first variable resistance layer 1161, and the second transition metal oxide 116a is in contact with the remaining part of the second face (that is the top surface herein) of the first variable resistance layer 1161.

With such a structure, the second transition metal oxide 116a having a low oxygen content atomic percentage is formed on the first transition metal oxide 116b having a high oxygen content atomic percentage, so that no spontaneous oxide film is formed on a surface of the first transition metal oxide 116b having a high oxygen content atomic percentage even when the element is exposed to the air after formation of the first transition metal oxide 116b. By so doing, the impact of a spontaneous oxide film on a face on which the first transition metal oxide 116b and the second transition metal oxide 116a are in contact with each other can be eliminated, which stabilizes formation of a conductive path in the first transition metal oxide 116b.

[Manufacturing Method]

Figure 17A:
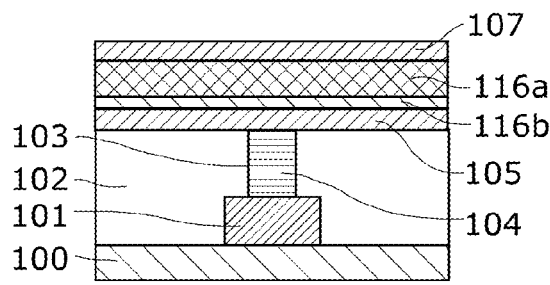
FIG. 17A shows a step in a method of manufacturing a nonvolatile memory element according to the third embodiment of the present invention.

FIGS. 17A to 17D show cross-sectional views of the nonvolatile memory element 30, to illustrate a method of manufacturing a major part thereof, according to the third embodiment of the present invention. With reference to these views, the method of manufacturing the major part of the nonvolatile memory element 30 according to this embodiment is described. The steps before FIG. 17A are the same or alike as those in FIGS. 4A to 4E and therefore not described.

As shown in FIG. 17A, in the step of forming the lower electrode 105 and the variable resistance layer 136, a conductive layer comprising a noble metal (such as Pt, Ir, or Pa) or the like which will be the lower electrode 105 is formed on the first interlayer insulating layer 102 so as to cover the first contact plug 104. Subsequently, the first variable resistance layer 1161 comprising the first transition metal oxide 116b is formed on the lower electrode 105. Here, $TaO_{x1}$ that is the first transition metal oxide 116b was formed in the reactive sputtering method in which a tantalum target is sputtered in the oxygen gas atmosphere. In this case, its oxygen content atomic percentage is 68 to 71 atm % (where x1 is greater than 2.1), its resistivity is 1E+7 mΩ·cm or more, and its layer thickness is 3 to 10 nm. Since the first transition metal oxide 116b has a high oxygen content atomic percentage, no spontaneous oxide film is formed even when exposed to the air after formation. Subsequently, the second transition metal oxide 116a is formed on the first transition metal oxide 116b. Here, $TaO_{x2}$ that is the second transition metal oxide 116a was formed using what is called a reactive sputtering method in which a tantalum target is sputtered in the argon and oxygen gas atmosphere. In this case, its oxygen content atomic percentage is 55 to 65 atm % (where x2 is 1.22 to 1.86), its resistivity is 1 to 50 mΩ·cm, and its layer thickness is 20 to 100 nm. Subsequently, a 20 to 100 nm-thick conductive layer comprising tantalum nitride or the like, which will eventually be the upper electrode 107, is formed on the second transition metal oxide 116a using a sputtering method.

Figure 17B:
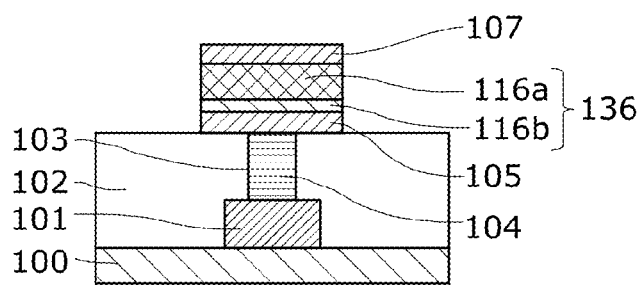
FIG. 17B shows a step in the method of manufacturing the nonvolatile memory element according to the third embodiment of the present invention.

Next, as shown in FIG. 17B, in the step of forming the variable resistance element 35, the lower electrode 105, the first variable resistance layer 1161 (i.e., the first transition metal oxide 116b), the second transition metal oxide 116a, and the upper electrode 107 are patterned using a mask to form a structure in which the second transition metal oxide 116a and the first variable resistance layer 1161 (i.e., the first transition metal oxide 116b) are located between the lower electrode 105 and the upper electrode 107. Although the patterning was collectively performed using the same mask here, the patterning may be performed for each step.

Figure 17C:
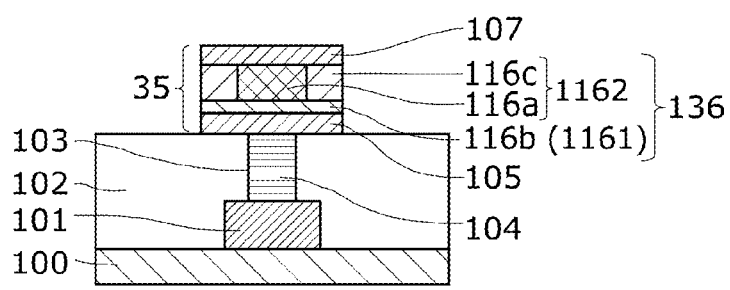
FIG. 17C shows a step in the method of manufacturing the nonvolatile memory element according to the third embodiment of the present invention.

Next, as shown in FIG. 17C, in the step of forming the transition metal compound 116c, using the plasma nitridation, the RTN, or the fluorine plasma exposure, the transition metal compound 116c containing either oxygen and nitrogen or oxygen and fluorine is formed on a lateral side of the second transition metal oxide 116a exposed after the patterning. The transition metal compound 116c formed as above has specific resistance of greater than 50 mΩ·cm. In addition, the thickness of the transition metal compound 116c (that is (S2−S1)/2 in FIG. 16) is in a range smaller than half the size of the variable resistance element 35 (that is S1/2 in FIG. 16). Thus, the transition metal compound 116c having high resistivity is formed on the lateral side of the second transition metal oxide 116a having low resistivity, which allows a reduction in the leak current from the second transition metal oxide 116a to the second interlayer insulating layer 108. It is to be noted that in the plasma nitridation, RTN, or fluorine plasma exposure used herein, the temperature range in the nitrogen or fluorine atmosphere was set to be 350 to 500 degrees Celsius. In the temperature range of 500 degrees Celsius or more, oxygen in the first transition metal oxide 116b is diffused to the second transition metal oxide 116a, which has a significant impact on resistance change characteristics of the element.

Figure 17D:
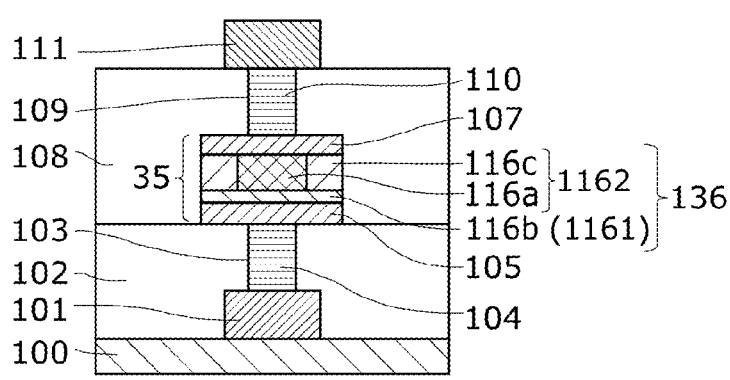
FIG. 17D shows a step in the method of manufacturing the nonvolatile memory element according to the third embodiment of the present invention.

At the end, as shown in FIG. 17D, the second interlayer insulating layer 108 having a thickness of 500 to 1000 nm is formed so as to cover the variable resistance layer 136, and in the same manufacturing method as shown in FIGS. 4B and 4C, the second contact hole 109 and the second contact plug 110 are formed. The second line 111 is then formed to cover the second contact plug 110, which completes the nonvolatile memory element 30.

With the above manufacturing method, the second transition metal oxide 116a can be formed on the first transition metal oxide 116b, so that no spontaneous oxide film is formed on a surface of the first transition metal oxide 116b having a high oxygen content atomic percentage even when the element is exposed to the air after formation of the first transition metal oxide 116b. By so doing, the impact of a spontaneous oxide film on a face on which the first transition metal oxide 116b and the second transition metal oxide 116a are in contact with each other can be eliminated, which stabilizes formation of a conductive path in the first transition metal oxide 116b.

Fourth Embodiment

Although the variable resistance layer includes two layers in the first to third embodiments described above as an example, the present invention is not limited thereto. Thus, the following describes, as the fourth embodiment, an example in which the variable resistance layer includes three layers.

Figure 18A:
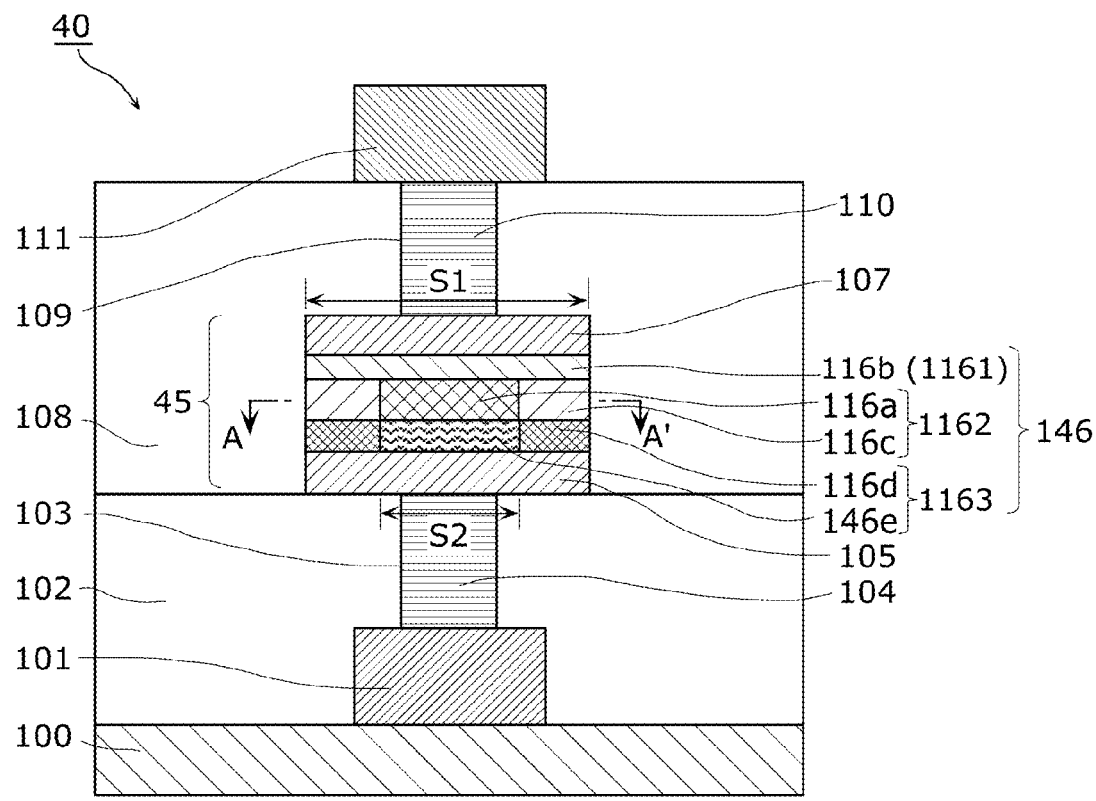
FIG. 18A is a cross-sectional view of a nonvolatile memory element according to the fourth embodiment of the present invention.
Figure 18B:
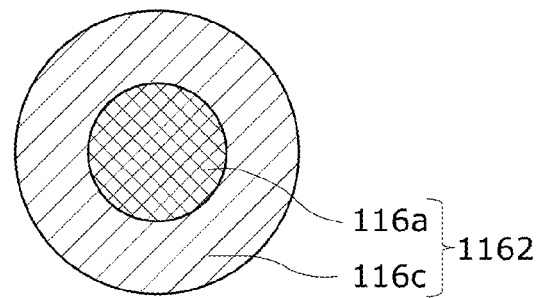
FIG. 18B shows a cross-sectional view taken along A-A' of FIG. 18A.

FIG. 18A is a cross-sectional view of a nonvolatile memory element 40 according to the fourth embodiment of the present invention. FIG. 18A shows a cross-sectional view of a structure of the nonvolatile memory element, and FIG. 18B shows a cross-sectional view taken along A-A' of FIG. 18A. The nonvolatile memory element 40 shown in FIGS. 18A and 18B, and the nonvolatile memory elements according to the first to third embodiments are different in structure of the variable resistance layer. Specifically, a variable resistance layer 146 of the nonvolatile memory element 40 includes three layers while the variable resistance layer of the nonvolatile memory element in each of the first to third embodiments includes two layers.

The variable resistance layer 146 is a layer disposed between the upper electrode 107 and the lower electrode 105 and has a resistance value that reversibly changes based on electric signals applied between these electrodes (the lower electrode 105 and the upper electrode 107). The variable resistance layer 146 includes three layers: the first variable resistance layer 1161 comprising the first transition metal oxide 116b; the second variable resistance layer 1162 comprising the second transition metal oxide 116a and a first transition metal compound 116c; and a third variable resistance layer 1163 comprising a third transition metal oxide 146e and a second transition metal compound 116d.

The second variable resistance layer 1162 comprises the second transition metal oxide 116a and the first transition metal compound 116c. The second transition metal oxide 116a has a lower oxygen content atomic percentage than an oxygen content atomic percentage of the first transition metal oxide 116b. Thus, the second transition metal oxide 116a has a smaller resistance value than a resistance value of the first transition metal oxide 116b. Furthermore, the first transition metal compound 116c contains either oxygen and nitrogen or oxygen and fluorine, and the transition metal compound 116c has a larger resistance value than a resistance value of the second transition metal oxide 116a. Thus, the second transition metal oxide 116a has a smaller resistance value than resistance values of the first transition metal oxide 116b and the first transition metal compound 116c.

The third variable resistance layer 1163 comprises the third transition metal oxide 146e and the second transition metal compound 116d. The third transition metal oxide 146e has a lower oxygen content atomic percentage than oxygen content atomic percentages of the first transition metal oxide 116b and the second transition metal oxide 116a. In other words, the third transition metal oxide 146e has resistivity lower than resistivity of the first transition metal oxide 116b and the second transition metal oxide 116a. The second transition metal compound 116d contains either oxygen and nitrogen or oxygen and fluorine and has a larger resistance value than a resistance value of the third transition metal oxide 146e. Thus, the third transition metal oxide 146e has a smaller resistance value than resistance values of the first transition metal oxide 116b and the second transition metal compound 116d.

Furthermore, the second transition metal compound 116d has a lower oxygen content atomic percentage than an oxygen content atomic percentage of the first transition metal compound 116c. In other words, the second transition metal compound 116d has lower resistivity than resistivity of the first transition metal compound 116c. In addition, the nitrogen content atomic percentage of the first transition metal compound 116c may be the same as or different from a nitrogen content atomic percentage of the second transition compound 116d.

As can be seen from the structure of the second variable resistance layer 1162 shown in FIGS. 18A and 18B, in the second variable resistance layer 1162 according to this embodiment, the second transition metal oxide 116a having a small resistance value is disposed in a central region of the second variable resistance layer 1162 while the first transition metal compound 116c having a large resistance value is disposed in a peripheral region of the second variable resistance layer 1162. Likewise, in the third variable resistance layer 1163, the third transition metal oxide 146e having a small resistance value is disposed in a central region of the third variable resistance layer 1163 while the second transition metal compound 116d having a large resistance value is disposed in a peripheral region of the third variable resistance layer 1163. The first transition metal compound 116c is in contact with at least part of the second face (that is the bottom surface herein) of the first variable resistance layer 1161, and the second transition metal oxide 116a is in contact with the remaining part of the second face (that is the bottom surface herein) of the first variable resistance layer 1161.

With such a structure, the first transition metal compound 116c having a large resistance value is disposed on a lateral side of the second transition metal oxide 116a having a small resistance value so that the area of a region S2, in the plane direction, of the second transition metal oxide 116a having a small resistance value (or the contact region between the second transition metal oxide 116a having a small resistance value and the first variable resistance layer 1161) is smaller than the area of an electrode region S1 of the upper electrode 107, resulting in an increase in density of current flowing in part of the first transition metal oxide 116b (i.e., the first variable resistance layer 1161) which is in contact with the second transition metal oxide 116a and resulting in facilitated formation of a conductive path in the first transition metal oxide 116b in the initialization of the nonvolatile memory element. This reduces the initialization voltage of the nonvolatile memory element 40 and enables initialization of the nonvolatile memory element 40 at low voltage.

Furthermore, the first variable resistance layer 1161 having the highest oxygen content atomic percentage, the upper electrode 107 that is one of the electrodes which has a higher standard electrode potential, the third variable resistance layer 1163 having the lowest oxygen content atomic percentage, and the lower electrode 105 that is the other of the electrodes (which has a lower standard electrode potential than the standard electrode potential of the upper electrode 107) are disposed in contact with each other so that the resistance of the first variable resistance layer 1161 in a region near the interface of the upper electrode 107 can reliably change and that, in a region near the interface of the lower electrode 105, incorrect operations are reduced, which can provide stable memory characteristics. This is because, in the mechanism of resistance change operation, the oxidation-reduction reaction near the electrode interface is dominant; the operation preferentially occurs at the interface in which oxygen, which can contribute to the oxidation-reduction reaction, is abundant.

Fifth Embodiment

Next, the fifth embodiment of a nonvolatile memory device according to an implementation of the present invention is described.

[Structure]

Figure 19:
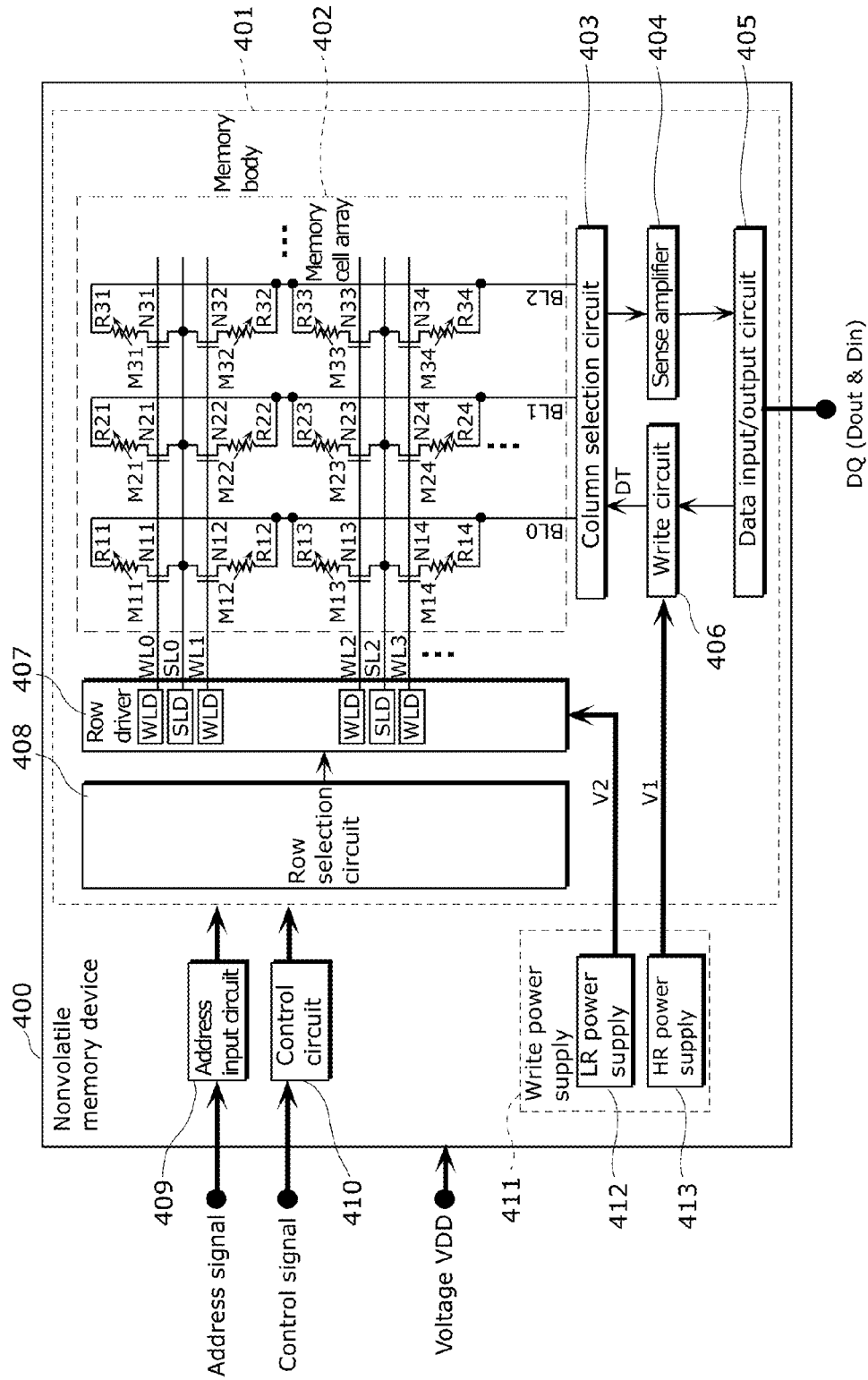
FIG. 19 is a block diagram showing a structure of a nonvolatile memory device according to the fifth embodiment of the present invention.

FIG. 19 is a block diagram showing a structure of a nonvolatile memory device 400 according to the fifth embodiment of the present invention. This nonvolatile memory device 400 is a memory device including, as a memory element, the nonvolatile memory element according to any of the first to fourth embodiments (denoted by a variable resistance symbol in this figure) and includes a memory body 401 on a semiconductor substrate. This memory body 401 includes: a memory cell array 402 in which a plurality of 1T1R memory cells are arranged in a matrix; a row selection circuit 408; a driver 407 including a word line driver WLD and a source line driver SLD; a column selection circuit 403; a write circuit 406 for writing information; a sense amplifier 404 that detects an amount of current flowing to a selected bit line and determines whether data is "1" or "0"; and a data input/output circuit 405 that executes input and output processing of input and output data via a terminal DQ.

Furthermore, this nonvolatile memory device 400 includes, as a write power supply 411, a low resistance (LR) power supply 412 and a high resistance (HR) power supply 413. Here, the low resistance (LR) means shifting the nonvolatile memory element (more accurately, the variable resistance element included in the nonvolatile memory element) from a high resistance state to a low resistance state while the high resistance (HR) means shifting the nonvolatile memory element (more accurately, the variable resistance element included in the nonvolatile memory element) from a low resistance state to a high resistance state, as described above. Output V2 from the LR power supply 412 is supplied to the row driver 407 while output V1 from the HR power supply 413 is supplied to the write circuit 406.

Furthermore, this nonvolatile memory device 400 includes an address input circuit 409 that receives an address signal from outside and a control circuit 410 that controls an operation of the memory body 401 based on a control signal received from outside.

The memory cell array 402 includes the plurality of 1T1R memory cells two-dimensionally arranged, in each of which cells the nonvolatile memory element and a transistor which is an example of the switching element are connected in series, and in this embodiment, the memory cell array 402 includes: a plurality of word lines WL0, WL1, WL2, . . . and bit lines BL0, BL1, BL2, . . . formed on the semiconductor substrate and arranged so as to cross each other; source lines SL0, SL2, . . . disposed between these word lines WL0, WL1, WL2, . . . ; a plurality of NMOS transistors N11, N12, N13, N21, N22, N23, N31, N32, N33, . . . (hereinafter referred to as "transistors N11, N12, . . . ") disposed at respective cross points of these word lines WL0, WL1, WL2, . . . and these bit lines BL0, BL1, BL2, . . . ; and a plurality of nonvolatile memory elements R11, R12, R13, R21, R22, R23, R31, R32, R33, . . . (hereinafter referred to as "nonvolatile memory elements R11, R12, . . . ") serially connected one-to-one to the transistors N11, 12, . . . . These word lines WL0, WL1, WL2, . . . , bit lines BL0, BL1, BL2, . . . , source lines SL0, SL02, . . . , transistors N11, N12, . . . , and nonvolatile memory elements R11, R12, . . . respectively constitute the plurality of 1T1R memory cells M11, M12, M13, M21, M22, M23, M31, M32, M33, . . . (hereinafter referred to as "memory cells M11, M12, . . . ") arranged in a matrix.

As shown in FIG. 19, the gates of the transistors N11, N21, N31, . . . are connected to the word line WL0, the gates of the transistors N12, N22, N32, . . . are connected to the word line WL1, and the gates of the transistors N13, N23, N33, . . . are connected to the word line WL2. The transistors N11, N21, N31, . . . and transistors N12, N22, N32, . . . are connected to each other, respectively, and connected in common to the source line SL0, and likewise, the transistors N13, N23, N33, . . . and transistors N14, N24, N34, . . . are connected in common to the source line SL2.

Furthermore, each of the nonvolatile memory elements R11, R12, R13, . . . has one terminal connected to the bit line BL0, and each of the nonvolatile memory elements R21, R22, R23, . . . has one terminal connected to the bit line BL1. Likewise, each of the nonvolatile memory elements R31, R32, R33, . . . has one terminal connected to the bit line BL2.

In FIG. 19, the nonvolatile memory element is denoted by a variable resistance symbol. The direction of an arrow on the variable resistance symbol indicates that the nonvolatile memory element changes from a low resistance state to a high resistance state when a positive voltage is applied in that direction (to the front tip of the arrow with respect to the rear end of the arrow). The nonvolatile memory element in the above embodiment changes from a low resistance state to a high resistance state when a positive voltage is applied to the first variable resistance layer 1161 (i.e., the front tip of the arrow) with respect to the second variable resistance layers 1162 and 1262 (i.e., the rear tip of the arrow).

The address input circuit 409 receives address signals from an external circuit (not shown) and outputs row address signals and column address signals to the row selection circuit 408 and the column selection circuit 403, respectively, based on such address signals. Here, the address signals are signals which indicate an address of a particular memory cell selected from among the plurality of memory cells M11, M12, . . . . The row address signals are signals which indicate an address of a row among addresses indicated in the address signals, and the column address signals are signals which indicate an address of a column among the addresses indicated in the address signals. It is to be noted that each of these row selection circuit 408 and column selection circuit 403 is an example of a selection circuit according to an implementation of the present invention which selects at least one of the plurality of memory cells M11 and so on included in the memory cell array 402 by applying a voltage pulse to the gate of the transistor N11 or the like included in at least one of the memory cells.

The control circuit 410 outputs, to the write circuit 406, a write signal with which application of a write voltage is instructed, according to input data Din received by the data input/output circuit 405, in a cycle of writing information. On the other hand, in a cycle of reading information, the control circuit 410 outputs, to the sense amplifier 404, a read signal with which a read operation is instructed.

The row selection circuit 408 receives the row address signals from the address input circuit 409 and selects one of the plurality of word lines WL0, WL1, WL2, . . . according to the received row address signals. On the basis of an output signal from the row selection circuit 408, the row driver 407 applies a predetermined voltage to the word line selected by the row selection circuit 408.

Likewise, the row selection circuit 408 receives the row address signals from the address input circuit 409 and selects one of the plurality of source lines SL0, SL1, SL2, . . . according to the received row address signals. On the basis of an output signal from the row selection circuit 408, the row driver 407 applies a predetermined voltage to the source line selected by the row selection circuit 408.

The column selection circuit 403 receives the column address signals from the address input circuit 409, selects one of the plurality of bit lines BL0, BL1, BL2, . . . according to the received column address signals, and applies a write voltage or a read voltage to the selected bit line.

The write circuit 406 is a circuit which applies a write voltage pulse to the nonvolatile memory element included in the memory cell selected by the selection circuit according to an implementation of the present invention, via the transistor included in the memory cell, and in this embodiment, when the write circuit 406 receives a write signal from the control circuit 410, the write circuit 406 then outputs, to the column selection circuit 403, a signal with which application of a write voltage to the selected bit line is instructed. Here, "write" includes low resistance (LR) writing (i.e., "0" writing) that changes the nonvolatile memory element from a high resistance state to a low resistance state, and inversely, high resistance (HR) writing (i.e., "1" writing) that changes the nonvolatile memory element from a low resistance state to a high resistance state.

The sense amplifier 404 detects an amount of current flowing to the selected bit line to be read and determines whether data is "1" or "0", in the cycle of reading information. The resulting output data DO is output to an external circuit via the data input/output circuit 405.

[Operation]

Next, an operation of the nonvolatile memory device 400 configured as above is described; a write circle for writing information and a read cycle for reading information are described separately.

Figure 20A:
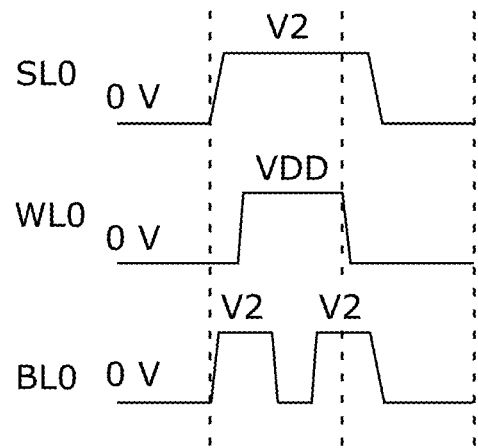
FIG. 20A shows a timing chart of operation in a cycle of writing information "0" by the nonvolatile memory device according to an implementation of the present invention.
Figure 20B:
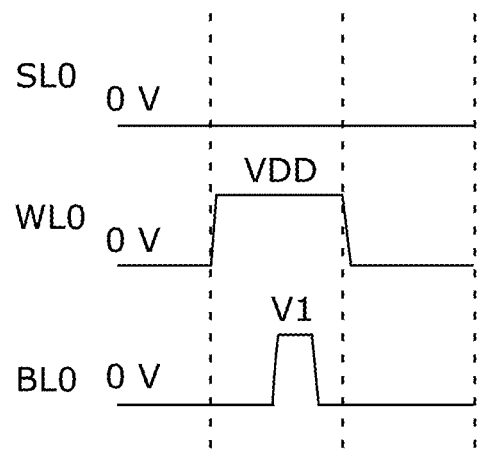
FIG. 20B shows a timing chart of operation in a cycle of writing information "1" by the nonvolatile memory device according to an implementation of the present invention.
Figure 20C:
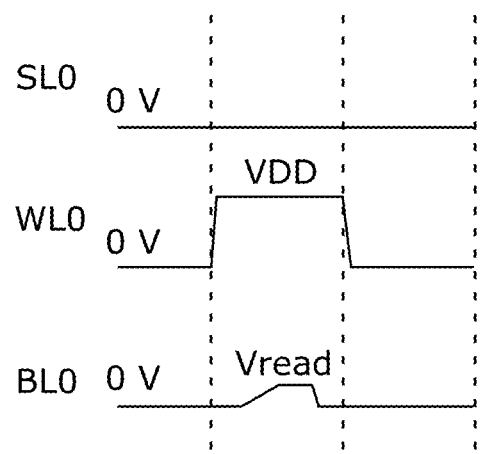
FIG. 20C shows a timing chart of operation in a cycle of reading information by the nonvolatile memory device according to an implementation of the present invention.

FIGS. 20A to 20C show timing charts of operation examples of the nonvolatile memory device 400 in an embodiment of the present invention. Here, the operation examples are described assuming that information "1" is assigned when the variable resistance layer is in a high resistance state while information "0" is assigned when the variable resistance layer is in a low resistance state. Furthermore, the description below assumes that the memory cell M11 in FIG. 19 has been selected, and only the case where information is written to and read from the selected memory cell M11 is described.

In the description below, the voltages V1 and V2 are voltages generated at the HR power supply 413 and the LR power supply 412, respectively, a voltage Vread is a read voltage generated by the sense amplifier 404, and a voltage VDD is a power supply voltage supplied to the nonvolatile memory device 400.

In the cycle of writing the information "0" to the memory cell M11 shown in FIG. 20A, first, the column selection circuit 403 and the row selection circuit 408 set the selected bit line BL0 and the selected source line SL0, respectively, at the voltage V2 (for example, 2.2 V) (for the row selection circuit 408, via the row driver 407). The row selection circuit 408 sets the selected word line WL0 at the voltage VDD (for example, 2.2 V) via the row driver 407 and turns on the NMOS transistor N11 of the selected memory cell M11. Next, via the column selection circuit 403, the write circuit 406 sets the selected bit line BL0 at the voltage 0 V only during a predetermined period and then sets the selected bit line BL0 at the voltage V2 again to output a write voltage pulse. At this stage, a write voltage is applied between the lower electrode and the upper electrode of the nonvolatile memory element, which causes the nonvolatile memory element R11 to shift from a high resistance state to a low resistance state. Subsequently, the row selection circuit 408 sets the word line WL0 at the voltage 0 V via the row driver 407 and turns the NMOS transistor N11 off, thereby completing the writing of the information "0".

In the cycle of writing the information "1" to the memory cell M11 shown in FIG. 20B, first, the column selection circuit 403 and the row selection circuit 408 set the selected bit line BL0 and the selected source line SL0, respectively, at the voltage 0 V (for the row selection circuit 408, via the row driver 407). The row selection circuit 408 sets the selected word line WL0 at the voltage VDD (for example, 2.2 V) via the row driver 407 and turns on the NMOS transistor N11 of the selected memory cell M11. Next, via the column selection circuit 403, the write circuit 406 sets the selected bit line BL0 at the voltage V1 (for example, 2.2 V) only during a predetermined period and then sets the selected bit line BL0 at the voltage 0 V again. At this stage, a write voltage is applied between the lower electrode and the upper electrode of the nonvolatile memory element, which causes the nonvolatile memory element R11 to shift from a low resistance state to a high resistance state. Subsequently, the row selection circuit 408 sets the word line WL0 at the voltage 0 V via the row driver 407 and turns the NMOS transistor N11 off, thereby completing the writing of the information "1".

In the cycle of reading information from the memory cell M11 shown in FIG. 20C, first, the column selection circuit 403 and the row selection circuit 408 set the selected bit line BL0 and the selected source line SL0, respectively, at the voltage 0 V (for the row selection circuit 408, via the row driver 407). Next, the row selection circuit 408 sets the selected word line WL0 at the voltage VDD via the row driver 407 and turns on the NMOS transistor N11 of the selected memory cell M11. Next, the sense amplifier 404 sets the selected bit line BL0 at the read voltage Vread via the column selection circuit 403 only during a predetermined period and detects an amount of current flowing to the selected memory cell M11, thereby determining whether the information is "0" or "1". Subsequently, the row selection circuit 408 sets the word line WL0 at the voltage 0 V via the row driver 407 and turns the NMOS transistor N11 off, thereby completing the operation of reading information.

The structure of the nonvolatile memory device depends on the structures of the memory cell array, the nonvolatile memory elements in the memory cell array, and so on. Specifically, the source lines of the memory cell array arranged in the direction orthogonal to the bit lines in FIG. 19 may instead be arranged in the direction parallel to the bit lines. In this case, the source line driver circuit SLD is disposed on the column selection circuit side.

Furthermore, in the case where the nonvolatile memory element is disposed in an orientation such that the resistance of the nonvolatile memory element increases when current flows from the bit line toward the source line, the output V1 from the HR power supply 413 is supplied to the write circuit 406, and in the opposite case, to the driver 407. The output V2 from the LR power supply 412 is supplied to the driver 407, which is different from the driver to which the output V1 from the HR power supply 413 is supplied, or to the write circuit 406.

Sixth Embodiment

Next, an embodiment of a design support method for a nonvolatile memory element according to an implementation of the present invention is described.

Figure 21:
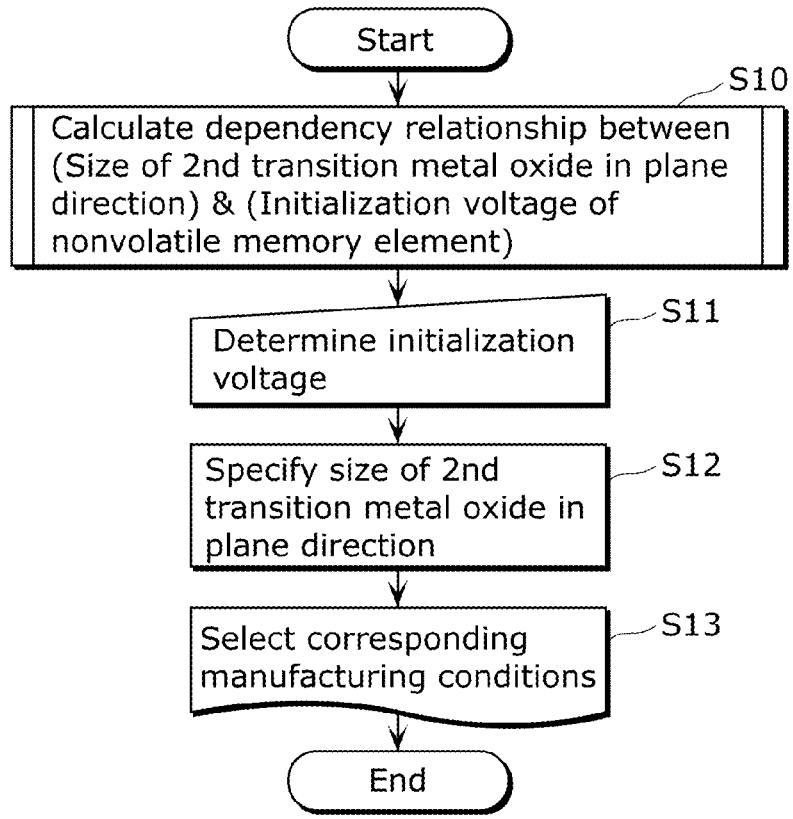
FIG. 21 is a flowchart showing an entire procedure in a design support method for a nonvolatile memory element according to the sixth embodiment of the present invention.
Figure 22:
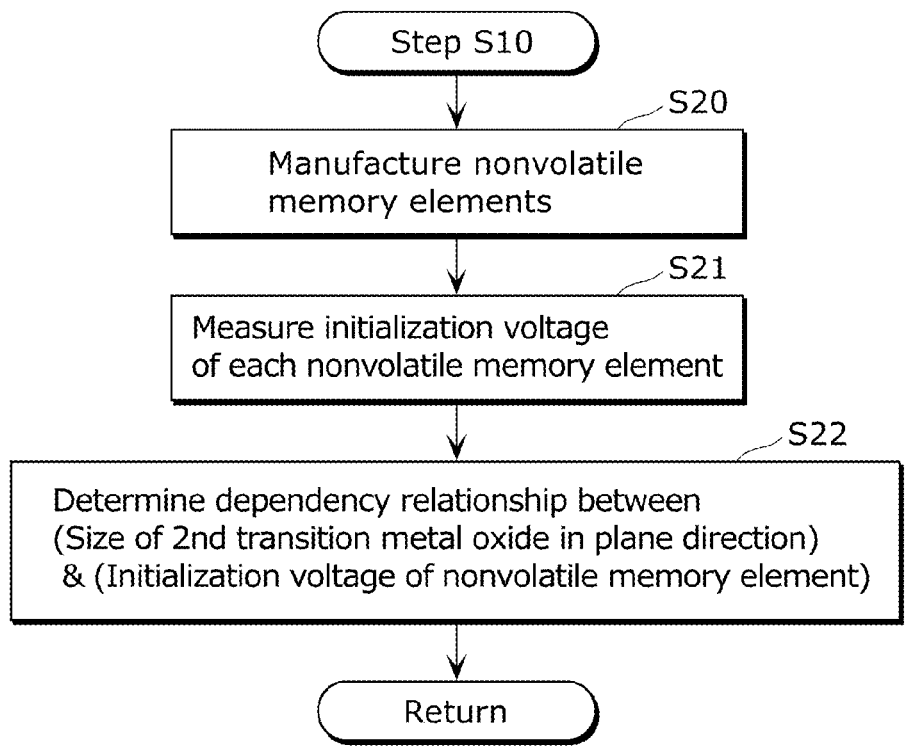
FIG. 22 is a flowchart showing a detailed procedure in Step S10 of FIG. 21.
Figure 23:
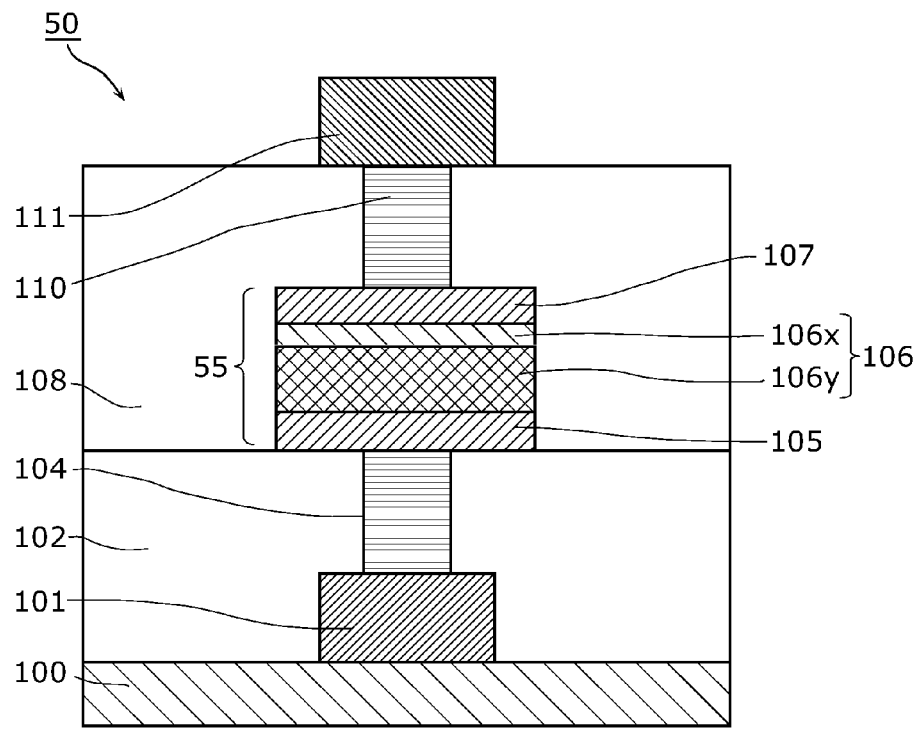
FIG. 23 is a cross-sectional view of a conventional variable resistance nonvolatile memory element.
Figure 24:
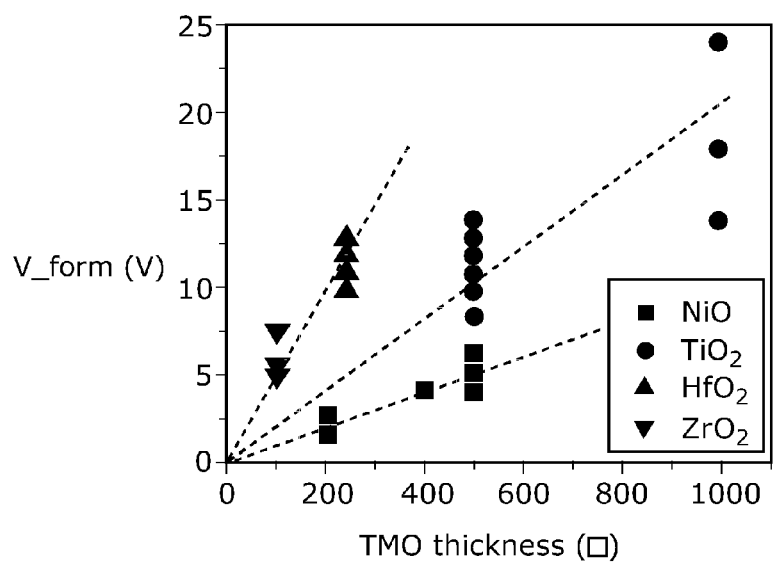
FIG. 24 shows characteristics of dependency of a thickness of a transition metal oxide relative to initialization voltage in a conventional nonvolatile memory element.

FIG. 21 is a flowchart showing an entire procedure in a design support method for the nonvolatile memory element according to the sixth embodiment of the present invention, and FIG. 22 is a flowchart showing a detailed procedure in Step S10 of FIG. 21.

This design support method is a method of supporting design of the nonvolatile memory element disclosed in the first to fifth embodiments, and in more detail, is a method of determining the size, in the plane direction, of the second transition metal oxide (in more detail, an area of contact between the second transition metal oxide and the first variable resistance layer) which satisfies requirements when the nonvolatile memory element to be designed receives a required initialization voltage.

As shown in FIG. 21, such a dependency relationship as shown in FIG. 3A, that is, the dependency relationship between the size, in the plane direction, of the second transition metal oxide and the initialization voltage of the nonvolatile memory element including the second transition metal oxide is calculated in advance (S10). Next, the initialization voltage required for the nonvolatile memory element to be designed is determined (S11). With reference to the dependency relationship calculated in Step S10, the size, in the plane direction, of the second transition metal oxide which corresponds to that determined initialization voltage is then specified (S12). At the end, a manufacturing condition which corresponds to this specified size is output (S13).

Here, the above calculation of dependency relationship (S10) is, in more detail, implemented in the procedure shown in FIG. 22. Specifically, a plurality of nonvolatile memory elements comprising the second transition metal oxides which are different in size in the plane direction are manufactured in advance (S20). Next, the manufactured nonvolatile memory elements are initialized to measure the initialization voltages of the nonvolatile memory elements (S21). At the end, the size, in the plane direction, of the second transition metal oxide and the initialization voltage of each of these nonvolatile memory elements are plotted in association with each other, to determine the dependency relationship between the size, in the plane direction, of the second transition metal oxide and the initialization voltage of the nonvolatile memory element comprising that second transition metal oxide (S22).

Such a design support method can be implemented as a program which is executed by a computer. Specifically, a processor included in a computer executes the design support program to obtain a combination of the size, in the plane direction, of the second transition metal oxide and the initialization voltage of each of the nonvolatile memory elements from a user via an input element, such as a keyboard, (S10) stores the obtained data as the above dependency relationship in a memory device, such as a hard disk, (S11) receives the required (determined) initialization voltage for the nonvolatile memory element to be designed, from a user via the input element, such as a keyboard, (S12) specifies the size, in the plane direction, of the second transition metal oxide which corresponds to that received initialization voltage, with reference to the dependency relationship stored in the memory device, and (S13) outputs, to a display or the like, a manufacturing condition for providing the specified size. Regarding the dependency relationship, the processor may store, as the above dependency relationship, an approximate curve calculated by the least square method or the like using the combination of the size, in the plane direction, of the second metal oxide and the initialization voltage inputted by a user.

Although the nonvolatile memory element, the method of manufacturing the same, the nonvolatile memory device, and the design support method for the nonvolatile memory element according to implementations of the present invention are described above based on the embodiments, the present invention is not limited to these embodiments. The present invention includes an embodiment obtained by making various modifications that those skilled in the art could think of, to these embodiments, or an embodiment obtained by a given combination of constituents in these embodiments.

For example, although the variable resistance element included in the nonvolatile memory element according to an implementation of the present invention has a cross section (i.e., a cross section orthogonal to the direction in which the current flows) in form of a circle, the present invention is not limited to this shape and the shape may be any shape, such as a rectangle, a square, or an ellipse. This is because, as long as the transition metal compound is formed in part (i.e., the central or peripheral region) of the second variable resistance layer, the density of current flowing from the second variable resistance layer to the first variable resistance layer increases more than otherwise, which produces the effects of the present invention.

Furthermore, although the second transition metal oxide and the transition metal compound are in contact with the bottom surface of the first variable resistance layer in the nonvolatile memory element according to an implementation of the present invention, the second transition metal oxide and the transition metal compound may be in contact with either the upper surface or the lower surface of the first variable resistance layer. The bottom surface of the first variable resistance layer here indicates one of the upper surface and the lower surface of the first variable resistance layer, which is in contact with the second variable resistance layer.

Furthermore, the transition metal oxide included in the nonvolatile memory element according to an implementation of the present invention is not limited to an oxide of Ta and may be any of the transition metal oxides of Ni, Ti, Hf, Zr, and so on. Specifically, the first transition metal oxide and the second transition metal oxide included in the nonvolatile memory element according to an implementation of the present invention are not limited to those which comprise transition metals that contain tantalum as primary components. This is because the function effects of the present invention are not those which are produced only with the transition metal oxide which contains tantalum as a primary component. For example, the first transition metal oxide and the second transition metal oxide included in the nonvolatile memory element may comprise transition metals that contain hafnium (Hf) and zirconium (Zr) as primary components. For example, in the case where the transition metal oxides which contain hafnium as primary components are used for the first transition metal oxide and the second transition metal oxide, supposing that the composition of the first hafnium oxide is $HfO_x$ and the composition of the second hafnium oxide is $HfO_y$, it is preferred that the approximate range of $0.9 \leq y \leq 1.6$ and $1.8 < x < 2.0$ be satisfied and the first hafnium oxide have a thickness of 3 nm to 4 nm. For example, in the case where the transition metal oxides which contain zirconium as primary components are used for the first transition metal oxide and the second transition metal oxide, supposing that the composition of the first zirconium oxide is $ZrO_x$ and the composition of the second zirconium oxide is $ZrO_y$, it is preferred that the approximate range of $0.9 \leq y \leq 1.4$ and $1.9 < x < 2.0$ be satisfied and the first zirconium oxide have a thickness of 1 nm to 5 nm.

Furthermore, in the case where the transition metal oxides which contain hafnium as primary components are used for the first transition metal oxide and the second transition metal oxide, it is sufficient that, for example, the second hafnium oxide layer is formed on the lower electrode 105 using what is called a reactive sputtering method in which a Hf target is sputtered in argon gas and oxygen gas. After this second hafnium oxide layer is formed, it is possible to form the first hafnium oxide layer by exposing a surface of the second hafnium oxide layer to plasma of argon gas and oxygen gas. The oxygen content atomic percentage of the second hafnium oxide layer can easily be adjusted by changing a flow ratio of the oxygen gas to the argon gas in the reactive sputtering, as in the above-described case of the tantalum oxide. The temperature of a substrate 1 can be a room temperature without the particular need of heating.

Furthermore, the thickness of the first hafnium oxide layer can easily be adjusted by the length of time of exposure to the plasma of argon gas and oxygen gas.

In the case where the transition metal oxides which contain zirconium as primary components are used for the first transition metal oxide and the second transition metal oxide, for example, the second zirconium oxide layer is formed on the lower electrode 105 using what is called a reactive sputtering method in which a Zr target is sputtered in argon gas and oxygen gas. After this second zirconium oxide layer is formed, it is possible to form the first zirconium oxide layer by exposing a surface of the second zirconium oxide layer to plasma of argon gas and oxygen gas. The oxygen content atomic percentage of the second zirconium oxide layer can easily be adjusted by changing a flow ratio of the oxygen gas to the argon gas in the reactive sputtering, as in the above-described case of the tantalum oxide. The temperature of the substrate 1 can be a room temperature without the particular need of heating as in the above case.

Furthermore, the thickness of the first zirconium oxide layer can easily be adjusted by the length of time of exposure to the plasma of argon gas and oxygen gas.

Although the above description indicates that the first transition metal oxide and the second transition metal oxide may comprise tantalum oxide, hafnium oxide, and zirconium oxide, applicable materials are not limited to those cited. The first transition metal oxide and the second transition metal oxide which are located between the upper and lower electrodes may contain, for example, a tiny amount of elements other than tantalum, hafnium, and zirconium as long as a layer comprising oxide of these materials is included as a main variable resistance layer that involves a change in resistance. A small amount of other elements can be included on purpose by minor adjustment of the resistance value or the like, and such a case is also encompassed by the scope of present invention. This is based on that adding nitrogen to the variable resistance layer, for example, can lead to an increase in the variable resistance value of the variable resistance layer and an improvement in reactivity of the resistance change.

In some cases, a tiny amount of unintended elements are mixed due to residual gas, a discharge of gas from a wall of a vacuum vessel, or the like cause when the resistance film is formed by sputtering, and such a case of inclusion of a tiny amount of elements in the resistance film is also naturally encompassed by the scope of the present invention.

Furthermore, the transition metal compound included in the nonvolatile memory element according to an implementation of the present invention is not limited to TaON and may be any of transition metal compounds, such as NiON, TiON, HfON, and ZrON.

INDUSTRIAL APPLICABILITY

The nonvolatile memory element according to an implementation of the present invention is a variable resistance nonvolatile memory element in which no hillocks are present in electrodes, and has effects that a conductive path is easily formed in a transition metal oxide, that the initialization voltage can be reduced, and that the element operates at low voltage, and moreover, since it is possible to prevent oxidation of a surface of a contact plug which is exposed when the element is miniaturized and possible to prevent separation which is attributed to a volume increase caused by oxidation of the transition metal oxide, the nonvolatile memory element according to an implementation of the present invention is therefore effective as a memory device, such as ReRAM, using a variable resistance nonvolatile memory element; for example, a memory element for an electronic device or the like, such as a portable information device and an information home appliance.

REFERENCE SIGNS LIST

10, 20, 30, 40, 50 Nonvolatile memory element
15, 25, 35, 45, 55, 502 Variable resistance element
100 Substrate
101 First line
102 First interlayer insulating layer 103 First contact hole
104, 501 First contact plug
105, 301a, 301b, 401a, 401b Lower electrode
106, 116, 126, 136, 146, 402a, 402b Variable resistance layer
106x, 302a, 302b, 1161 First variable resistance layer
106y, 303a, 303b, 1162, 1262 Second variable resistance layer
107, 304a, 304b, 403a, 403b Upper electrode
107a First upper electrode
107b Second upper electrode
108 Second interlayer insulating layer
109 Second contact hole
110, 503 Second contact plug
111 Second line
116a, 126a Second transition metal oxide
116b First transition metal oxide
116c, 126c Transition metal compound
116d Second transition metal compound
146e Third transition metal oxide
400 Nonvolatile memory device
401 Memory body
402 Memory cell array
403 Column selection circuit
404 Sense amplifier
405 Data input/output circuit
406 Write circuit
407 Row driver
408 Row selection circuit
409 Address input circuit
410 Control circuit
411 Write power supply
412 LR power supply
413 HR power supply
504 Tungsten oxide
1163 Third variable resistance layer

The invention claimed is:

1. A nonvolatile memory element comprising:
a first electrode and a second electrode that are formed above a semiconductor substrate; and
a variable resistance layer located between the first electrode and the second electrode and having a resistance value that reversibly changes based on an electric signal applied between the first electrode and the second electrode,
wherein the variable resistance layer comprises at least two layers including a first variable resistance layer and a second variable resistance layer,
the first variable resistance layer has a first face connected to the first electrode,
the first variable resistance layer has a second face connected to a first face of the second variable resistance layer,
the first variable resistance layer comprises a first transition metal oxide,
the second variable resistance layer comprises a second transition metal oxide and a first transition metal compound,
the second transition metal oxide has an oxygen content atomic percentage lower than an oxygen content atomic percentage of the first transition metal oxide,
the first transition metal compound contains either oxygen and nitrogen or oxygen and fluorine and is in contact with at least part of the second face of the first variable resistance layer, and
the second transition metal oxide is in contact with a remaining part of the second face of the first variable resistance layer.

2. The nonvolatile memory element according to claim 1, wherein the second transition metal oxide and the first transition metal compound comprise a same transition metal.

3. The nonvolatile memory element according to claim 1, wherein the second transition metal oxide is disposed in a central region of the second variable resistance layer, and
the first transition metal compound is disposed in a peripheral region of the second variable resistance layer.

4. The nonvolatile memory element according to claim 1, wherein the second transition metal oxide is disposed in a peripheral region of the second variable resistance layer, and
the first transition metal compound is disposed in a central region of the second variable resistance layer.

5. The nonvolatile memory element according to claim 1, wherein the nitrogen or fluorine contained in the first transition metal compound is combined with a dangling bond contained in the first transition metal compound, to terminate the dangling bond.

6. The nonvolatile memory element according to claim 1, wherein the second transition metal oxide and the first transition metal compound are equal in thickness.

7. The nonvolatile memory element according to claim 1, wherein the variable resistance layer further comprises a third variable resistance layer,
the variable resistance layer comprises three layers: the first variable resistance layer; the second variable resistance layer; and the third variable resistance layer,
the third variable resistance layer comprises a third transition metal oxide and a second transition metal compound,
the third transition metal oxide has a resistivity lower than resistivities of the first transition metal oxide and the second transition metal oxide,
the second transition metal compound has a resistivity lower than a resistivity of the first transition metal compound,
the second transition metal compound contains either oxygen and nitrogen or oxygen and fluorine and is in contact with a second face of the first transition metal compound, and
the third transition metal oxide is in contact with a second face of the second transition metal oxide.

8. A nonvolatile memory device comprising:
a memory cell array including a plurality of memory cells each of which includes the nonvolatile memory element according to claim 1 and a switching element which are connected in series;
a selection circuit that selects at least one of the memory cells included in the memory cell array, by turning ON the switching element in the memory cell;
a write circuit that applies a write voltage pulse to the nonvolatile memory element included in the memory cell selected by the selection circuit; and
a sense amplifier that detects an amount of current flowing to the nonvolatile memory element included in the memory cell selected by the selection circuit, to determine data stored in the nonvolatile memory element.

9. A method of supporting design of the nonvolatile memory element according to claim 1, the method comprising:
calculating a dependency relationship between a size, in a plane direction, of the second transition metal oxide and an initialization voltage of the nonvolatile memory element;

determining the initialization voltage required for a nonvolatile memory element to be designed;

specifying the size, in the plane direction, of the second transition metal oxide, which corresponds to the initialization voltage determined in the determining, with reference to the dependency relationship calculated in the calculating; and outputting a manufacturing condition which corresponds to the size specified in the specifying.

10. The method according to claim 9,
wherein the calculating includes:

manufacturing, on a single substrate, a plurality of nonvolatile memory elements which are different in the size and each of which is the nonvolatile memory element;

initializing, at a different initialization voltage, each of the nonvolatile memory elements manufactured in the manufacturing, to measure the initialization voltage; and determining the dependency relationship of each of the nonvolatile memory elements by associating the size and the initialization voltage.

\* \* \* \* \*